United States Patent
Roh et al.

(10) Patent No.: US 8,136,021 B2
(45) Date of Patent: Mar. 13, 2012

(54) GENERATION OF GOLAY-BASED SYSTEMATIC BLOCK CODE SUPPORTING VARIOUS SIZES

(75) Inventors: Dongwook Roh, Gyeonggi-do (KR); Nam Yul Yu, Gyeonggi-do (KR); Dae Won Lee, Gyeonggi-do (KR); Sang Gook Kim, San Diego, CA (US); Yu Jin Noh, Gyeonggi-do (KR); Ki Jun Kim, Gyeonggi-do (KR); Jung Hyun Cho, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 670 days.

(21) Appl. No.: 12/345,394

(22) Filed: Dec. 29, 2008

(65) Prior Publication Data

US 2009/0217139 A1   Aug. 27, 2009

Related U.S. Application Data

(60) Provisional application No. 61/039,087, filed on Mar. 24, 2008.

(30) Foreign Application Priority Data

Dec. 27, 2007   (KR) ........................ 10-2007-0138845

(51) Int. Cl.
   *G06F 11/00* (2006.01)

(52) U.S. Cl. ........................................ 714/783; 714/781
(58) Field of Classification Search ........................ None
   See application file for complete search history.

(56) References Cited

U.S. PATENT DOCUMENTS

| | | | |
|---|---|---|---|
| 2003/0066014 A1* | 4/2003 | Van Dijk et al. | 714/774 |
| 2004/0034828 A1* | 2/2004 | Hocevar | 714/800 |
| 2004/0098659 A1* | 5/2004 | Bjerke et al. | 714/776 |
| 2006/0036926 A1 | 2/2006 | Hocevar et al. | |
| 2006/0064627 A1* | 3/2006 | Berens et al. | 714/790 |
| 2006/0200733 A1* | 9/2006 | Stankovic et al. | 714/801 |
| 2007/0011569 A1* | 1/2007 | Vila Casado et al. | 714/758 |
| 2009/0183048 A1* | 7/2009 | Tzannes et al. | 714/752 |
| 2009/0313520 A1* | 12/2009 | Chung et al. | 714/751 |
| 2010/0257427 A1* | 10/2010 | Xu et al. | 714/752 |

FOREIGN PATENT DOCUMENTS

EP   1422829   5/2004

* cited by examiner

*Primary Examiner* — Gabriel Chu
(74) *Attorney, Agent, or Firm* — Lee, Hong, Degerman, Kang & Waimey

(57) ABSTRACT

A method for generating block codes from Golay code and a method and apparatus for encoding data are provided. The method can effectively generate codes having various lengths, various dimensions, and superior hamming weight distribution, and encodes data such as control information having various lengths into codes having strong resistance to channel errors, resulting in an increase of error correction performance.

46 Claims, 14 Drawing Sheets

(24,12) Extended systematic Golay code | (n,12) Golay-based systematic code

GENERATION OF GOLAY-BASED SYSTEMATIC BLOCK CODE SUPPORTING VARIOUS SIZES

CROSS-REFERENCE TO RELATED APPLICATIONS

Pursuant to 35 U.S.C. §120, this application claims the benefit of U.S. Provisional Application Ser. No. 61/039,087 filed on Mar. 24, 2008, the contents of which is hereby incorporated by reference herein in its entirety. Pursuant to 35 U.S.C. § 119(a), this application claims the benefit of earlier filing date and right of priority to Korean Application No. 10-2007-0138845, filed on Dec. 27, 2007, the contents of which is incorporated by reference herein in its entirety.

FIELD OF THE INVENTION

The present invention relates to a data coding, and more particularly to a method for effectively generating codes having various code lengths and dimensions using a Golay code, and a method and apparatus for coding data into codes having strong resistance to any errors.

DESCRIPTION OF THE RELATED ART

A communication system according to a general encoding method does not transmit original data to be transmitted, encodes the original data, and transmits the encoded original data. This encoding method can be generally classified into two encoding methods, i.e., a Trellis coding method and a block coding method. For example, the Trellis coding method may be a convolution coding method or a turbo-coding method, and the block coding method may be a Low Density Parity Bit Coding (LDPC) method. Individual coding methods can be used according to necessary characteristics.

Due to characteristics of a mobile communication system, control information needs to be defined as a short-length bit stream, such that a small amount of communication resources can be used. In more detail, a channel quality indicator (CQI) for use in a 3rd Generation Partnership Project (3GPP) Long Term Evolution (LTE) system can be considered. If the CQI is transferred to an uplink, this CQI can also be transmitted over a physical uplink control channel (PUCCH). However, due to LTE characteristics, resources capable of being used as the PUCCH must be a very small amount of resources. Also, wrong control information has a decisive influence upon the system, such that it is preferable that a very superior error correction capability be assigned to a process for transmitting channel information over the PUCCH. Due to the above-mentioned characteristics, a preferred coding method for the CQI transferred to the PUCCH must code data into a short-length code having strong error correction protection characteristics.

The encoding method for allowing the 3GPP LTE system to transmit the CQI over the PUCCH will hereinafter be described in detail. A maximum of bits capable of being transmitted over the PUCCH should be around 20, and the number of CQI bits used as information to be transmitted should be around 10. However, the above-mentioned number of bits may be changed according to various situations, such that the number of information bits may be greater or less than 10 bits and the number of coded bits may be greater or less than 20 bits. In other words, the above-mentioned encoding method must be basically based on a structure of (20, 10), and at the same time must support various combinations of (20−m, 10+n). In this case, "m" or "n" may have a variety of positive or negative integers. For example, "m" may have any one of integers between "0" and "4", and "n" may have any one of integers between "−5" and "2".

However, provided that the conventional coding method is mechanically used, the length of a code may be excessively long or the error correction capability may be deteriorated, and it has difficulty in effectively supporting the above-mentioned various combinations.

SUMMARY OF THE INVENTION

In one aspect of the present invention, a method of coding information for transmission in a mobile communication system is provided. The method includes storing a single matrix including a first identity matrix having r rows and c columns and a first parity matrix having s rows and t columns, determining a generating matrix according to the single matrix and a code (n, k), the generating matrix including a second identity matrix having equal to or less than r rows and equal to or less than c columns and a second parity matrix having equal to or less than s rows and equal to or less than t columns, encoding information bits into codeword for transmission using the generating matrix, wherein a number of coded bits per codeword is n and a number of information bits coded to generate each codeword is k and transmitting the codeword, wherein the second identity matrix is a subset of the first identity matrix, the second parity matrix is a subset of the first parity matrix and the second identity matrix and the second parity matrix are based on n and k.

It is contemplated that $12 \leq n \leq 24$, $k=12$, $r=12$, $c=12$, $s=12$, and $t=12$. It is further contemplated that $n \leq 24$, $n-12 \leq k \leq 12$, $r=12$, $c=12$, $s=12$, and $t=12$.

It is contemplated that $n=20$, $1 \leq k \leq 14$, $r=14$, $c=14$, $s=19$, and $t=14$. It is further contemplated that the whole or part of single matrix is determined according to a systematic extended Golay code.

It is contemplated that the second parity matrix smaller than the first parity matrix is determined by puncturing at least a row or a column of the first parity matrix. It is further contemplated that a specific row or column that is punctured is determined between a transmitting entity and a receiving entity.

It is contemplated that the second identity matrix smaller than the first identity matrix is determined by puncturing at least a row or a column of the first identity matrix. It is further contemplated that a specific row or column that is punctured is determined between a transmitting entity and a receiving entity.

In another aspect of the present invention, a method of coding information for transmission in a mobile communication system is provided. The method includes storing a single matrix having 24 rows and 12 columns and including a first identity matrix and a first parity matrix, determining a generating matrix according to the single matrix and a code (n, k), the generating matrix having equal to or less than 24 rows and equal to or less than 12 columns and including a second identity matrix and a second parity matrix, encoding information bits into code words for transmission using the generating matrix, wherein a number of coded bits per codeword is n and a number of information bits coded to generate each codeword is k and transmitting the code words, wherein the second identity matrix is a subset of the first identity matrix, the second parity matrix is a subset of the first parity matrix and the second identity matrix and the second parity matrix are based on n and k.

It is contemplated that the single matrix is determined according to a systematic extended Golay code. It is further contemplated that the single matrix based on the systematic extended Golay code includes a specific first identity matrix and a specific first parity matrix.

It is contemplated that second parity matrix smaller than the first parity matrix is determined by puncturing at least a row or a column of the first parity matrix. It is further contemplated that a specific row or column that is punctured is determined between a transmitting entity and a receiving entity.

It is further contemplated that the second identity matrix smaller than the first identity matrix is determined by puncturing at least a row or a column of the first identity matrix. It is further contemplated that a specific row or column that is punctured is determined between a transmitting entity and a receiving entity.

In another aspect of the present invention, a method of coding information for transmission in a mobile communication system is provided. The method includes storing a single matrix including a first identity matrix having 14 rows and 14 columns and a first parity matrix having 19 rows and 14 columns, determining a generating matrix according to the single matrix and a code (n, k), the generating matrix including a second identity matrix having equal to or less than 14 rows and equal to or less than 14 columns and a second parity matrix having equal to or less than 19 rows and equal to or less than 14 columns, encoding information bits into code words for transmission using the generating matrix, wherein a number of coded bits per codeword is n and a number of information bits coded to generate each codeword is k and transmitting the code words, wherein the second identity matrix is a subset of the first identity matrix, the second parity matrix is a subset of the first parity matrix and the second identity matrix and the second parity matrix are based on n and k.

It is contemplated that the second parity matrix smaller than the first parity matrix is determined by puncturing at least a row or a column of the first parity matrix. It is further contemplated that a specific row or column that is punctured is determined between a transmitting entity and a receiving entity.

It is contemplated that the second identity matrix smaller than the first identity matrix is determined by puncturing at least a row or a column of the first identity matrix. It is further contemplated that a specific row or column that is punctured is determined between a transmitting entity and a receiving entity.

It is contemplated that the part of single matrix is determined according to a systematic extended Golay code. It is further contemplated that the single matrix includes a specific first identity matrix and a specific first parity matrix.

In another aspect of the present invention, a method of receiving coded information in a mobile communication system is provided. The method includes storing a single matrix including a first identity matrix having r rows and c columns and a first parity matrix having s rows and t columns, receiving code words including information encoded using a generating matrix, determining the generating matrix according to the single matrix and a code (n, k), the generating matrix including a second identity matrix having equal to or less than r rows and equal to or less than c columns and a second parity matrix having equal to or less than s rows and equal to or less than t columns and decoding the received code words into the information using the generating matrix, wherein a number of coded bits per codeword is n and a number of information bits coded to generate each codeword is k, wherein the second identity matrix is a subset of the first identity matrix, the second parity matrix is a subset of the first parity matrix and the second identity matrix and the second parity matrix are based on n and k.

It is contemplated that $12 \leq n \leq 24$, $k=12$, $r=12$, $c=12$, $s=12$, and $t=12$. It is further contemplated that $n \leq 24$, $n-12 \leq k \leq 12$, $r=12$, $c=12$, $s=12$, and $t=12$.

It is contemplated that $n=20$, $1 \leq k \leq 14$, $r=14$, $c=14$, $s=19$, and $t=14$. It is further contemplated that the whole or part of the single matrix is determined according to a systematic extended Golay code.

It is contemplated that the second parity matrix smaller than the first parity matrix is determined by puncturing at least a row or a column of the first parity matrix. It is further contemplated that a specific row or column that is punctured is determined between a transmitting entity and a receiving entity.

It is contemplated that the second identity matrix smaller than the first identity matrix is determined by puncturing at least a row or a column of the first identity matrix. It is further contemplated that a specific row or column that is punctured is determined between a transmitting entity and a receiving entity.

In another aspect of the present invention, a method of receiving coded information in a mobile communication system is provided. The method includes storing a single matrix having 24 rows and 12 columns and including a first identity matrix and a first parity matrix, receiving code words including information encoded using a generating matrix, determining the generating matrix according to the single matrix and a code (n, k), the generating matrix having equal to or less than 24 rows and equal to or less than 12 columns and including a second identity matrix and a second parity matrix and decoding the received code words into the information using the generating matrix, wherein a number of coded bits per codeword is n and a number of information bits coded to generate each codeword is k, wherein the second identity matrix is a subset of the first identity matrix, the second parity matrix is a subset of the first parity matrix and the second identity matrix and the second parity matrix are based on n and k.

It is contemplated that the single matrix is determined according to a systematic extended Golay code. It is further contemplated that the single matrix based on the systematic extended Golay code includes a specific first identity matrix and a specific first parity matrix.

It is contemplated that the second parity matrix smaller than the first parity matrix is determined by puncturing at least a row or a column of the first parity matrix. It is further contemplated that a specific row or column that is punctured is determined between a transmitting entity and a receiving entity.

It is contemplated that the second identity matrix smaller than the first identity matrix is determined by puncturing at least a row or a column of the first identity matrix. It is further contemplated that a specific row or column that is punctured is determined between a transmitting entity and a receiving entity.

In another aspect of the present invention, a method of receiving coding information in a mobile communication system is provided. The method includes storing a single matrix including a first identity matrix having 14 rows and 14 columns and a first parity matrix having 19 rows and 14 columns, receiving code words including information encoded using a generating matrix, determining the generating matrix according to the single matrix and a code (n, k), the generating matrix including a second identity matrix having equal to or less than 14 rows and equal to or less than 14 columns and a second parity matrix having equal to or less than 19 rows and equal to or less than 14 columns, decoding the received code words into the information using the generating matrix, wherein a number of coded bits per codeword is n and a number of information bits coded to generate each codeword is k, wherein the second identity matrix is a subset of the first identity matrix, the second parity matrix is a subset of the first parity matrix and the second identity matrix and the second parity matrix are based on n and k.

It is contemplated that the part of the single matrix is determined according to a systematic extended Golay code. It is further contemplated that the single matrix includes a specific first identity matrix and a specific first parity matrix.

It is contemplated that the second parity matrix smaller than the first parity matrix is determined by puncturing at least a row or a column of the first parity matrix. It is further contemplated that a specific row or column that is punctured is determined between a transmitting entity and a receiving entity.

It is contemplated that the second identity matrix smaller than the first identity matrix is determined by puncturing at least a row or a column of the first identity matrix. It is further contemplated that a specific row or column that is punctured is determined between a transmitting entity and a receiving entity.

Additional features and advantages of the invention will be set forth in the description which follows, and in part will be apparent from the description, or may be learned by practice of the invention. It is to be understood that both the foregoing general description and the following detailed description of the present invention are exemplary and explanatory and are intended to provide further explanation of the invention as claimed.

These and other embodiments will also become readily apparent to those skilled in the art from the following detailed description of the embodiments having reference to the attached figures, the invention not being limited to any particular embodiments disclosed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. Features, elements, and aspects of the invention that are referenced by the same numerals in different figures represent the same, equivalent, or similar features, elements, or aspects in accordance with one or more embodiments.

FIG. 15 illustrates the (19, 10) block code generated by the method of FIG. 14.

FIG. 16 illustrates the (18, 10) block code generated by the method of FIG. 14.

FIG. 17 illustrates the (17, 10) block code generated by the method of FIG. 14.

FIG. 18 illustrates the (16, 10) block code generated by the method of FIG. 14.

DETAILED DESCRIPTION OF THE PREFERRED EMBODIMENTS

Figure 1:
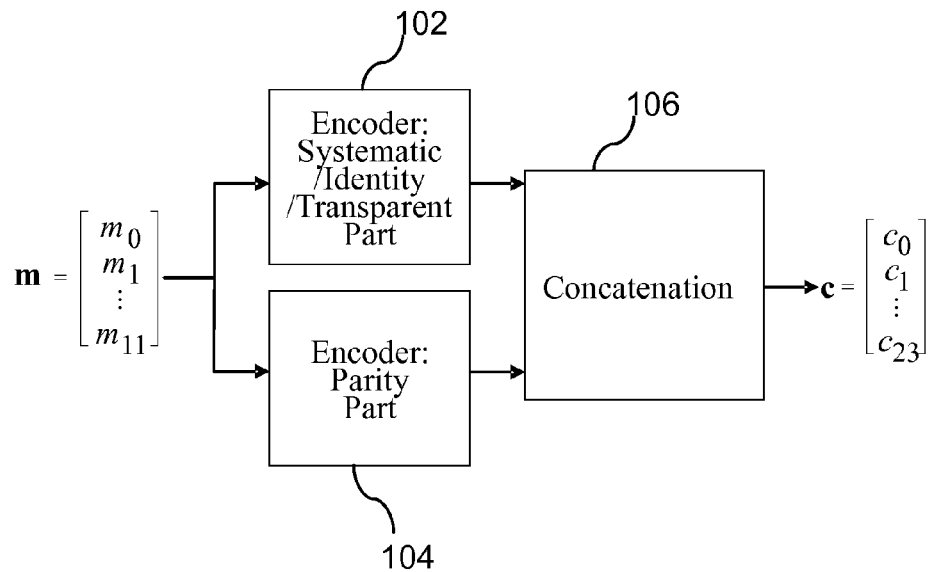
FIG. 1 is a block diagram showing a configuration of an encoder for encoding information bits according to one embodiment of the present invention the present invention.

The present invention relates to an apparatus and method for generating variable size Golay based systematic block codes. Reference will now be made in detail to the preferred embodiments of the present invention, examples of which are illustrated in the accompanying drawings.

As indicated herein, an (n, k) code represents a code having a coding bit number of n and an information bit number of k.

Unless otherwise stated, for convenience of description, a generating matrix is represented by a basis sequence table. The coding method for encoding information bits using the generating matrix as described herein is related to methods used with respect to a transport format combination identifier (TFCI) code of the 3GPP release 99. More specifically, the method of the present invention includes sequentially allocating information bits from a left basis sequence, multiplying the basis sequence with the information bits, and adding (exclusive OR sum) all the multiplied sequences by the information bit number using a binary arithmetic method to generate coding bits.

Coding using a code generated according to the present invention can be performed using one basis sequence table when the number of information bits is variable. Therefore, various information sizes can be supported. Accordingly, the basis sequence table is configured according to a maximum size of the information. If the maximum number of information bits necessary for actual application is smaller than the suggested size of the basis sequence table, a basis sequence table from which a basis sequence corresponding to the information bits exceeding the maximum bit number is deleted is preferably used.

It should be understood that the exchange of 0 and 1 in the generated code by a coding theory does not have an influence on the characteristics of the code. Accordingly, a table obtained by exchanging 0 and 1 with each other in the basis sequence table represents the same code.

In addition, even in the change of the order of bits coded by the coding theory, the same coding characteristics are obtained. Accordingly, the exchange of rows with each other in the basis sequence table represents the same code.

The basis sequence suggested in the present patent is designed such that the number of information bits varies and the number of coding bits varies. Accordingly, a code obtained by deleting a specific column from a specific basis sequence table is also considered in various embodiments of the present invention.

For example, if the basis sequence table is (20, 14), a basis sequence table (16, 13) obtained by deleting four consecutive rows from the lower side of the basis sequence table and deleting one column from the right side of the basis sequence table is also an application example of the (20, 14) basis sequence table. Therefore, in the present invention, the rows and columns of a basis sequence table have the largest sizes, and the rows and columns having smaller sizes are obtained by sequentially deleting the rows and columns of the basis sequence table from the lower side and the right side. As described above, it should be noted that the table obtained by changing the locations of the row and the column or exchanging 0 and 1 in the basis sequence table having the reduced size represents the same code.

In the present invention, in the representation of the basis sequence table, the information bit is started from a leftmost column as a first index and a rightmost column is used as a last index, and the coding bit is started from an uppermost row as a first index and a lowermost row is used as a last index.

A basis sequence having a specific pattern may not be preferably used in a specific channel estimation method. In this case, a table obtained by deleting a specific basis sequence from the table suggested by the present patent according to systems may be considered. For example, the basis sequence of all 0 may be omitted since the coding performance after erasing the all 0 sequence is the same and it can be implemented as only the number of information bits is reduced. Accordingly, the basis sequence table obtained by deleting the specific basis sequence from the basis sequence table suggested by the present patent is already considered at the time of the design of the present patent.

Where the selected length of a base code is short and the number of coding bits is increased in order to achieve more robust error correction capability in transmission bits, it is preferable to generate a new code corresponding to the increased number of coding bits. However, the actual design of the new code is restricted. Accordingly, as a simple generation method, a method of repeating the base code by a desired length may be considered. If the desired length is not equal to the integral multiple of the length of the base code, a method of repeating the base code such that the length of the code is larger than the desired length and eliminating excessive bits may be considered. An optimal puncturing pattern may be found each time, but, for example, a method of performing puncturing using a rate matching block used in the 3GPP may be considered.

Preferably, a Golay code is considered for the block coding design as the base code. A (24, 12) extended Golay code is obtained by extending a (23, 12) quadratic residue code having an original minimum Hamming distance of 7, and as a result, an extended Golay code has a minimum Hamming distance of 8. The (24, 12) Golay code is a code having a largest minimum Hamming distance among codes having a length of 24 and a dimension of 12.

In the present invention, the information bits to be encoded are represented by the vector m' shown in equation 1:

$$m'[m_0 m_1 \ldots m_{11}] \quad \text{(Equation 1)}$$

An example of the 12×24 generating matrix of the (24, 12) extended systematic Golay code is shown in Table 1.

TABLE 1

| Index | Basis sequence of Generator matrix |
|---|---|
| $M_{i,0}$ | [1, 0, 0, 0, 0, 0, 0, 0, 0, 0, 0, 0, 1, 1, 1, 1, 1, 1, 1, 1, 1, 1, 1, 1] |
| $M_{i,1}$ | [0, 1, 0, 0, 0, 0, 0, 0, 0, 0, 0, 0, 1, 1, 1, 0, 1, 1, 1, 0, 0, 0, 1, 0] |
| $M_{i,2}$ | [0, 0, 1, 0, 0, 0, 0, 0, 0, 0, 0, 0, 1, 1, 0, 1, 1, 1, 0, 0, 0, 1, 0, 1] |
| $M_{i,3}$ | [0, 0, 0, 1, 0, 0, 0, 0, 0, 0, 0, 0, 1, 0, 1, 1, 1, 0, 0, 0, 1, 0, 1, 1] |
| $M_{i,4}$ | [0, 0, 0, 0, 1, 0, 0, 0, 0, 0, 0, 0, 1, 1, 1, 1, 0, 0, 0, 1, 0, 1, 1, 0] |
| $M_{i,5}$ | [0, 0, 0, 0, 0, 1, 0, 0, 0, 0, 0, 0, 1, 1, 1, 0, 0, 0, 1, 0, 1, 1, 0, 1] |
| $M_{i,6}$ | [0, 0, 0, 0, 0, 0, 1, 0, 0, 0, 0, 0, 1, 1, 0, 0, 0, 1, 0, 1, 1, 0, 1, 1] |
| $M_{i,7}$ | [0, 0, 0, 0, 0, 0, 0, 1, 0, 0, 0, 0, 1, 0, 0, 0, 1, 0, 1, 1, 0, 1, 1, 1] |
| $M_{i,8}$ | [0, 0, 0, 0, 0, 0, 0, 0, 1, 0, 0, 0, 1, 0, 0, 1, 0, 1, 1, 0, 1, 1, 1, 0] |
| $M_{i,9}$ | [0, 0, 0, 0, 0, 0, 0, 0, 0, 1, 0, 0, 1, 0, 1, 0, 1, 1, 0, 1, 1, 1, 0, 0] |
| $M_{i,10}$ | [0, 0, 0, 0, 0, 0, 0, 0, 0, 0, 1, 0, 1, 1, 0, 1, 1, 0, 1, 1, 1, 0, 0, 0] |
| $M_{i,11}$ | [0, 0, 0, 0, 0, 0, 0, 0, 0, 0, 0, 1, 1, 0, 1, 1, 0, 1, 1, 1, 0, 0, 0, 1] |

In Table 1, each column of the generating matrix, that is, each basis sequence, is represented by an index $M_i$.

The 12×24 generating matrix is represented by the vector $G'_{12\times24}$ shown in equation 2:

$$G'_{12\times24} = [I_{12\times12} | P'_{12\times12}] \quad \text{(Equation 2)}$$

where $I_{12\times12}$ is a 12×12 matrix representing the systematic portion of the 12×24 generating matrix $G'_{12\times24}$ and $P'_{12\times12}$ is a 12×12 matrix representing the parity portion of the 12×24 generating matrix $G'_{12\times24}$.

A codeword generated using the information bits m' and the 12×24 generating matrix $G'_{12\times24}$ is represented by the vector c' shown in equation 3.

$$c' = [c_0 c_1 \ldots c_{23}] = m' G'_{12\times24} \quad \text{(Equation 3)}$$

An alternative representation of the (24, 12) extended systematic Golay code will now be described. Although vectors are typically represented in row vector form in general information theory, it is preferable to represent vectors in column vector form in communication theory. It should be understood that a vector represented in a column form may be transposed to an equivalent vector represented in a row form and that such a change does not affect performance. Accordingly, the row vector representation of the m' and the 12×24 extended systematic Golay code shown in Table 1 are transposed into column vector form.

Therefore, the vector m' of the information bits discussed above is transposed, where the result is defined by the vector m shown in equation 4.

$$m = m'^T = \begin{bmatrix} m_0 \\ m_1 \\ \vdots \\ m_{11} \end{bmatrix} \quad \text{(Equation 4)}$$

The generating matrix $G'_{12\times24}$ is also transposed, where the result is defined by the vector $G_{24\times12}$ shown in equation 5:

$$G_{24\times12} = G'^T_{12\times24} = \begin{bmatrix} I_{12\times12} \\ P^T_{12\times12} \end{bmatrix} = \begin{bmatrix} I_{12\times12} \\ P_{12\times12} \end{bmatrix} \quad \text{(Equation 5)}$$

where $I_{12\times12}$ is a 12×12 matrix representing the systematic portion of the 24×12 generating matrix $G_{24\times12}$ and $P_{12\times12}$ is a 12×12 matrix representing the parity portion of the 24×12 generating matrix $G_{24\times12}$.

An example of the generating matrix $G_{24\times12}$ is shown in Table 2.

The exemplary generating matrix $G_{24\times12}$ shown in Table 2 is divided into two portions. The first portion represented by $I_{12\times12}$ is the systematic portion and comprises the first 12 rows, as indicated by indexes 0 to 11, of the generating matrix in Table 2. The second portion represented by $P_{12\times12}$ is the parity portion and comprises the subsequent 12 rows, as indicated by indexes 12 to 23, of the generating matrix $G_{24\times12}$ in Table 2.

noted that various parity matrix configurations are used in the present invention with respect to the embodiments of the invention described below.

With reference to Table 2, since the systematic portion of the generating matrix $G_{24\times12}$ comprises the first 12 rows of the generating matrix $G_{24\times12}$ and the parity portion of the generating matrix $G_{24\times12}$ comprises the subsequent 12 rows of the generating matrix $G_{24\times12}$, the systematic and parity portions can be generated at the time when the coding is performed as shown in FIG. 1.

FIG. 1 is a block diagram showing a configuration of an encoder for encoding information bits based on the (24, 12) extended systematic Golay code.

FIG. 1 includes the systematic portion encoder 102, the parity portion encoder 104, and the concatenation block 106. As shown in FIG. 1, the coding of the information bits represented by the vector m can be divided into two parts. For example, the systematic portion encoder 102 can receive and transmit the information bits without changing the information bits, and the parity portion encoder 104 can receive and encode the information bits into parity bits and can transmit the parity bits.

TABLE 2

| | i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|---|
| $I_{12\times12}$ | 0 | 1 | 0 | 0 | 0 | 0 | 0 | 0 | 0 | 0 | 0 | 0 | 0 |
| | 1 | 0 | 1 | 0 | 0 | 0 | 0 | 0 | 0 | 0 | 0 | 0 | 0 |
| | 2 | 0 | 0 | 1 | 0 | 0 | 0 | 0 | 0 | 0 | 0 | 0 | 0 |
| | 3 | 0 | 0 | 0 | 1 | 0 | 0 | 0 | 0 | 0 | 0 | 0 | 0 |
| | 4 | 0 | 0 | 0 | 0 | 1 | 0 | 0 | 0 | 0 | 0 | 0 | 0 |
| | 5 | 0 | 0 | 0 | 0 | 0 | 1 | 0 | 0 | 0 | 0 | 0 | 0 |
| | 6 | 0 | 0 | 0 | 0 | 0 | 0 | 1 | 0 | 0 | 0 | 0 | 0 |
| | 7 | 0 | 0 | 0 | 0 | 0 | 0 | 0 | 1 | 0 | 0 | 0 | 0 |
| | 8 | 0 | 0 | 0 | 0 | 0 | 0 | 0 | 0 | 1 | 0 | 0 | 0 |
| | 9 | 0 | 0 | 0 | 0 | 0 | 0 | 0 | 0 | 0 | 1 | 0 | 0 |
| | 10 | 0 | 0 | 0 | 0 | 0 | 0 | 0 | 0 | 0 | 0 | 1 | 0 |
| | 11 | 0 | 0 | 0 | 0 | 0 | 0 | 0 | 0 | 0 | 0 | 0 | 1 |
| $P_{12\times12}$ | 12 | 0 | 1 | 1 | 1 | 1 | 1 | 1 | 1 | 1 | 1 | 1 | 1 |
| | 13 | 1 | 1 | 1 | 0 | 1 | 1 | 1 | 0 | 0 | 0 | 1 | 0 |
| | 14 | 1 | 1 | 0 | 1 | 1 | 1 | 0 | 0 | 0 | 1 | 0 | 1 |
| | 15 | 1 | 0 | 1 | 1 | 1 | 0 | 0 | 0 | 1 | 0 | 1 | 1 |
| | 16 | 1 | 1 | 1 | 1 | 0 | 0 | 0 | 1 | 0 | 1 | 1 | 0 |
| | 17 | 1 | 1 | 1 | 0 | 0 | 0 | 1 | 0 | 1 | 1 | 0 | 1 |
| | 18 | 1 | 1 | 0 | 0 | 0 | 1 | 0 | 1 | 1 | 0 | 1 | 1 |
| | 19 | 1 | 0 | 0 | 0 | 1 | 0 | 1 | 1 | 0 | 1 | 1 | 1 |
| | 20 | 1 | 0 | 0 | 1 | 0 | 1 | 1 | 0 | 1 | 1 | 1 | 0 |
| | 21 | 1 | 0 | 1 | 0 | 1 | 1 | 0 | 1 | 1 | 1 | 0 | 0 |
| | 22 | 1 | 1 | 0 | 1 | 1 | 0 | 1 | 1 | 1 | 0 | 0 | 0 |
| | 23 | 1 | 0 | 1 | 1 | 0 | 1 | 1 | 1 | 0 | 0 | 0 | 1 |

A codeword generated using the information bits, that is, vector m, and the generating matrix $G_{24\times12}$ is represented by the vector c shown in equation 6.

$$c = c'^T = \begin{bmatrix} c_0 \\ c_1 \\ \vdots \\ c_{23} \end{bmatrix} = G_{24\times12} m = \begin{bmatrix} m \\ P_{12\times12} m \end{bmatrix} \quad \text{(Equation 6)}$$

It should be understood that although the parity matrix $P_{12\times12}$ has been transposed and thus the location of the parity matrix $P_{12\times12}$ within the generating matrix shown in Table 1 has changed, the same performance with respect to the minimum distance characteristics of the (24, 12) extended systematic Golay code is achieved. Accordingly, in the present invention, various parity matrixes may be configured in addition to the parity matrix $P_{12\times12}$ of Table 2. It should be also As further shown in FIG. 1, after the systematic and parity portions are encoded, the two encoded portions are provided to concatenation block 106 and are concatenated to generate a single codeword represented by the vector c. Alternatively, since the systematic portion of the codeword is situated at the beginning of the codeword, the configuration of the encoder shown in FIG. 1 can be simplified, as shown in FIG. 2.

Figure 2:
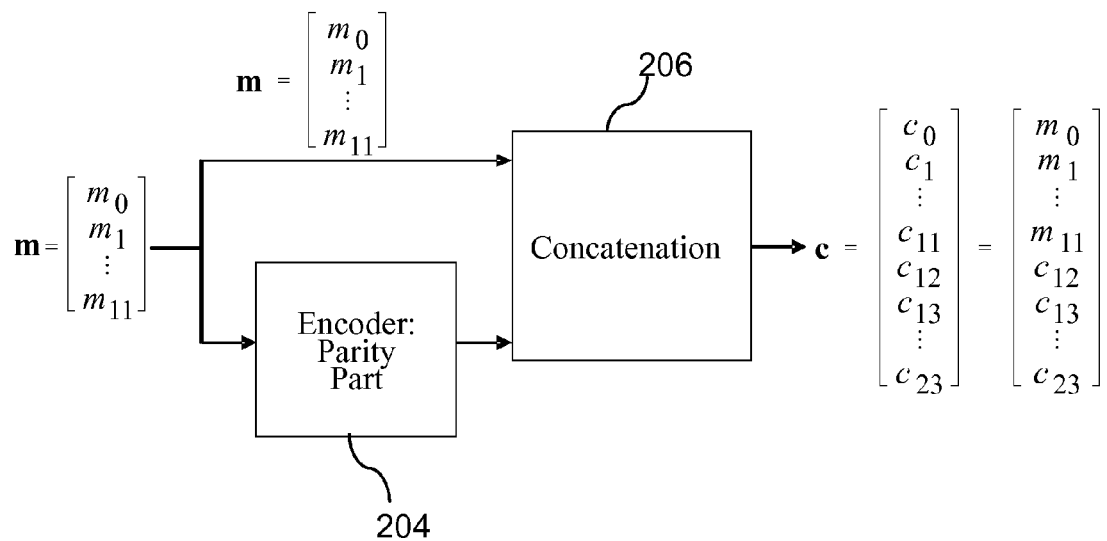
FIG. 2 is a block diagram showing a configuration of an encoder for encoding information bits according to another embodiment of the present invention the present invention.

FIG. 2 is a block diagram showing a configuration of an encoder for encoding information bits based on the (24, 12) extended systematic Golay code. FIG. 2 includes parity portion encoder 204 and concatenation block 206.

As shown in FIG. 2, the information bits represented by the vector m are provided directly to the concatenation block 206 and to the parity portion encoder 204. The information bits and the parity bits are received by the concatenation block 206 and concatenated to generate a single codeword represented by the vector c.

Figure 3:
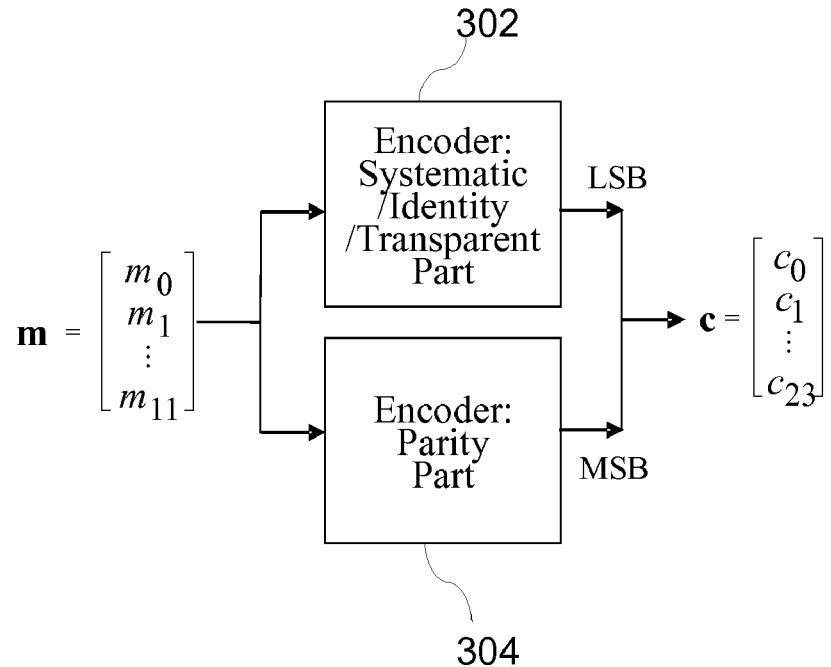
FIG. 3 is a block diagram showing a configuration of an encoder for encoding information bits according to another embodiment of the present invention the present invention.

Since the concatenation block 106 in FIG. 1 and the concatenation block 206 in FIG. 2 are each configured to arrange the encoded bits corresponding to the systematic and parity portions in a predetermined order, the concatenation block may be omitted, as shown in FIG. 3.

FIG. 3 is a block diagram showing a configuration of an encoder for encoding information bits based on the (24, 12) extended systematic Golay code. FIG. 3 includes the systematic portion encoder 302 and the parity portion encoder 304.

As shown in FIG. 3, the information bits represented by the vector m are received by the systematic portion encoder 302 and the parity portion encoder 304. In the configuration of FIG. 3, the systematic portion encoder 302 provides the encoded systematic portion and contains the corresponding bit location, such as least significant bit ("LSB"), of the encoded systematic portion in the generated codeword represented by the vector c. The parity portion encoder 304 provides the encoded parity portion and contains the corresponding bit location, such as most significant bit ("MSB"), of the encoded parity portion in the generated codeword c. As a result, the configuration of FIG. 3 does not require the use of a concatenation block.

Figure 4:
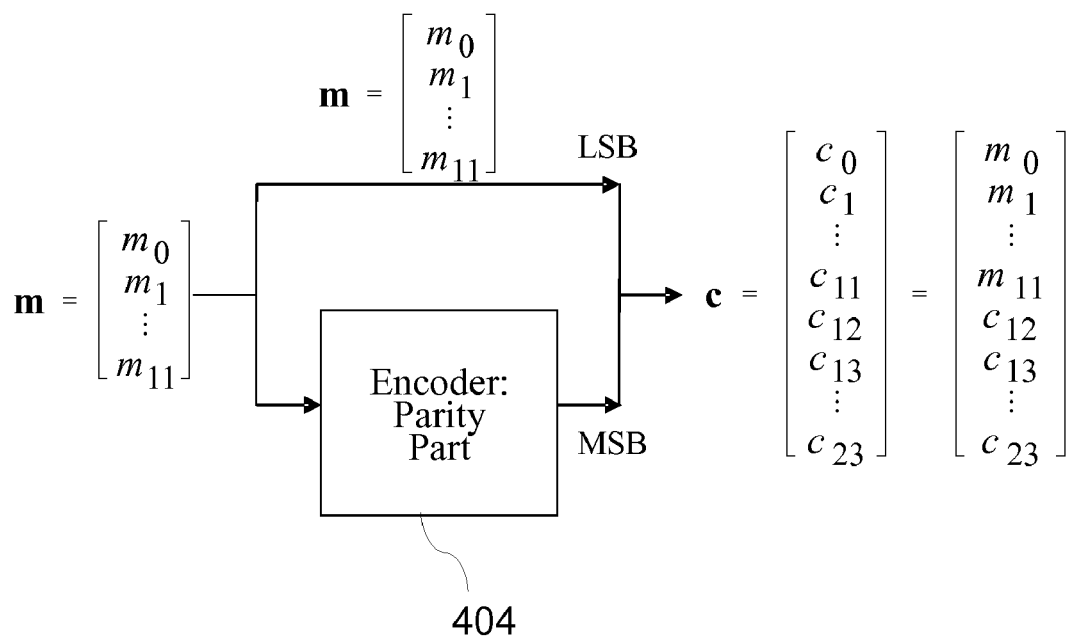
FIG. 4 is a block diagram showing a configuration of an encoder for encoding information bits according to another embodiment of the present invention the present invention.

As discussed above, since the systematic portion of the codeword is located at the beginning of the generated codeword, the configuration of the encoder shown in FIG. 3 can be simplified, as shown in FIG. 4.

FIG. 4 is a block diagram showing a configuration of an encoder for encoding information bits based on the (24, 12) extended systematic Golay code.

FIG. 4 includes parity portion encoder 404, which is configured to receive the information bits represented by the vector m and to generate the encoded parity portion of the codeword represented by the vector c. The configuration of the encoder shown in FIG. 4 contains the corresponding bit location, such as "LSB," of the information bits in the codeword c and the parity portion encoder 404 contains the corresponding bit location, such as "MSB," of the encoded parity portion in the codeword c.

Where a codeword having less than or equal to 24 bits is required, that is n≦24, a new systematic code (n, 12) must typically be generated for the desired value of n to achieve optimal results. As described below, to avoid the difficulties involved in the generation of such a new systematic code (n, 12), the encoding method of the present invention uses the (24, 12) extended systematic Golay code to generate the (n, 12) systematic code irrespective of change of the value of n. It should be noted that since at least a condition n≧12 is satisfied for meaningful coding, the accurate condition of n is 12≦n≦24.

Figure 5:
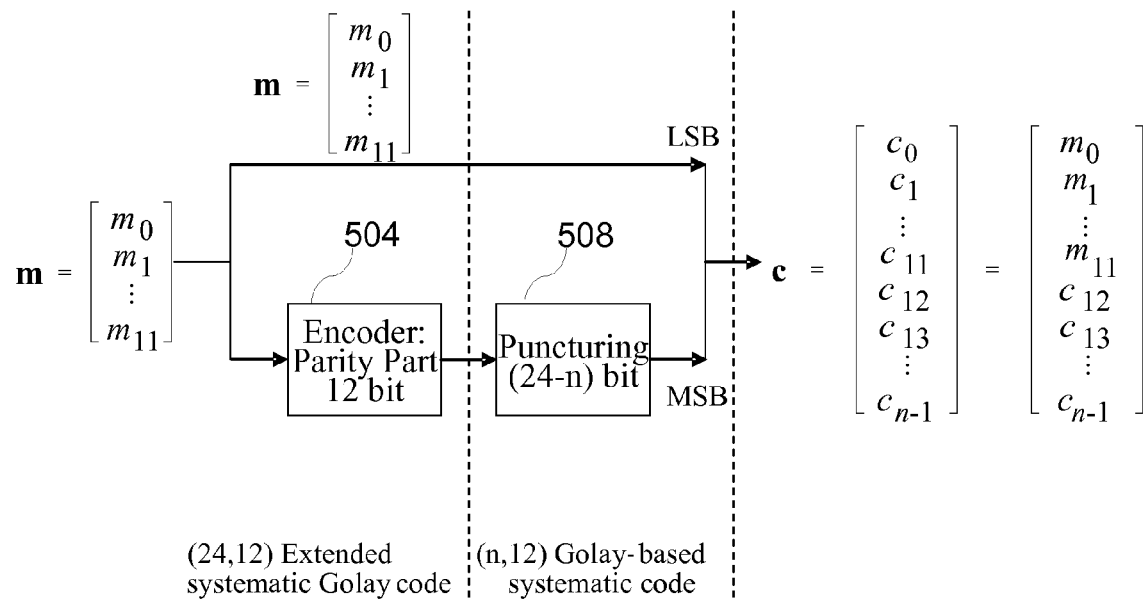
FIG. 5 is a block diagram showing a configuration of an encoder for encoding k information bits according to another embodiment of the present invention the present invention.

FIG. 5 is a block diagram showing a configuration of an encoder for encoding k information bits, where k=12, in a codeword having n bits, where n≦24, by generating an (n, 12) code based on the (24, 12) extended systematic Golay code in accordance with one embodiment of the present invention.

FIG. 5 includes parity portion encoder 504 and puncturing block 508.

As shown in FIG. 5, the parity portion encoder 504 receives the 12 information bits represented by the vector m. To generate the (n, 12) code from the (24, 12) extended systematic Golay code, (24-n) bits of the 12 parity bits in the (24, 12) extended systematic Golay code are punctured by the puncturing block 508. Since the generated code is a systematic code, the parity portion of the (24, 12) extended systematic Golay code is punctured while the systematic portion is maintained. It can be appreciated that the actual generation method can also be represented using the various configurations shown in FIGS. 1 through 3.

The configuration of the directly transparent encoder of information bits shown in FIG. 5 contains the corresponding bit location, such as "LSB," of the information bits in the codeword c, and the parity portion encoder 504 contains the corresponding bit location, such as "MSB," of the encoded parity portion in the codeword c.

It should be understood that based on the minimum distance performance, the same performance can be obtained regardless of which rows of the parity portion of the (24, 12) extended systematic Golay code are punctured. Although many puncturing patterns are possible, the puncturing of the parity portion of the (24, 12) extended systematic Golay code is preferably performed beginning from the last row of the parity portion for convenience of representation.

Where a codeword having less than or equal to 24 bits is required, that is, n≦24, and where the number of k information bits to be encoded is variable, a new (n, k) systematic code must typically be generated for the desired values of n and k to achieve optimal results.

However, the design of a new (n, k) systematic code for various values of k is difficult. Moreover, it is difficult to modify an encoder of a transmitter and a decoder of a receiver according to the number of message bits. Therefore, to avoid the difficulties involved in the generation of such a new (n, k) systematic code, the encoding method of the present invention generates the (n, k) systematic code using the (24, 12) extended systematic Golay code with a maximum portion common to all the (n, k) codes as much as possible. In other words, the encoding method of the present invention generates the (n, k) systematic code by determining an appropriate small parity matrix nested within a large parity matrix.

According to one embodiment of the invention, the (n, k) code to be generated based on the (24, 12) extended systematic Golay code is a subset of the (24, 12) extended systematic Golay code. Since the (n, k) code to be generated is a systematic code, only the parity part is actually necessary by the (n−k) bit number in the (n, k) code. The parity matrix $\overline{P}_{(n-k) \times k}$ of (n−k)×k is necessary for the parity of the (n−k) bit number.

The parity portion, that is, the (n−k)×k parity matrix of the (n, k) code, is represented by the vector $\overline{P}_{(n-k) \times k}$. In the present embodiment, due to the characteristics of the (24, 12) extended systematic Golay code, the range of values for k is 12−(24−n)≦k≦12, and thus the range of values for the parity bit number is (n−k) is n−12≦(n−k)≦12.

Therefore, since n≦24, the maximum size of the parity matrix $\overline{P}_{(n-k) \times k}$ is a 12×12 parity matrix $\overline{P}_{12 \times 12}$. Thus, the parity matrix $\overline{P}_{(n-k) \times k}$ is smaller than or equal to the parity matrix $P_{12 \times 12}$ of the (24, 12) extended systematic Golay code.

Since the parity matrix $\overline{P}_{(n-k) \times k}$ is smaller than or equal to the parity matrix $P_{12 \times 12}$ of the (24, 12) systematic extended Golay code, the parity matrix $\overline{P}_{(n-k) \times k}$ of the (n, k) code may be determined from a portion of the parity matrix $P_{12 \times 12}$ of the (24, 12) systematic extended Golay code.

For example, the parity matrix $\overline{P}_{(n-k) \times k}$ of the (n, k) code can be determined by selecting (n−k) rows and k columns of the parity matrix $P_{12 \times 12}$ of the (24, 12) systematic extended Golay code. Since the minimum distance characteristics are the same for the various selected rows and columns of the parity matrix $P_{12 \times 12}$, the parity matrix $\overline{P}_{(n-k) \times k}$ can be determined using any of the rows and columns from the parity matrix $P_{12 \times 12}$ of the (24, 12) systematic extended Golay code.

Figure 6:
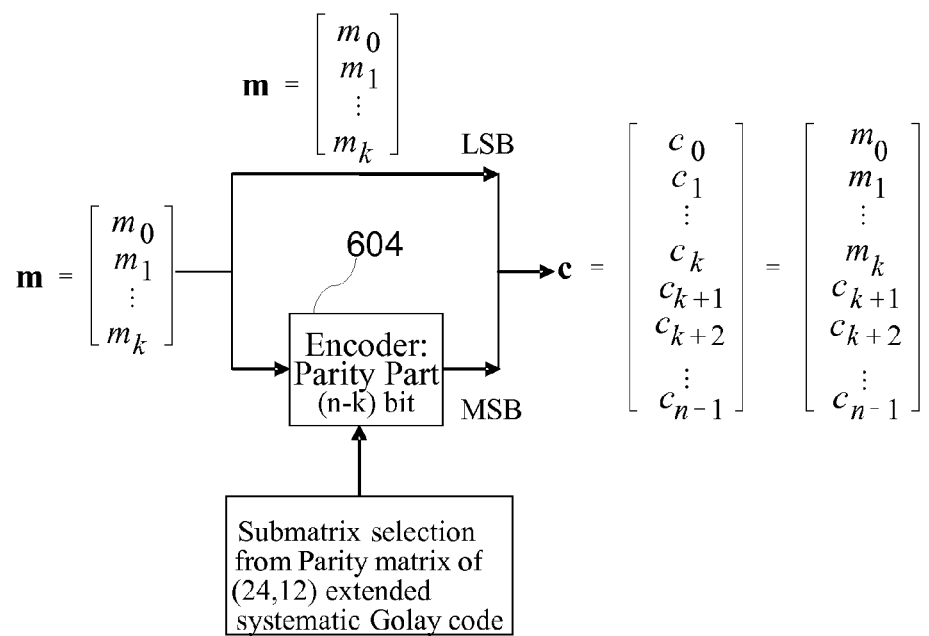
FIG. 6 is a block diagram showing a configuration of an encoder for encoding k information bits in a codeword having n bits according to one embodiment of the present invention the present invention.

FIG. 6 is a block diagram showing a configuration of an encoder for encoding k information bits in a codeword having n bits, where n≦24, based on the (24, 12) extended systematic Golay code in accordance with one embodiment of the present invention.

FIG. 6 includes parity portion encoder 604 configured to receive k the information bits represented by the vector m and to determine the parity matrix $\overline{P}_{(n-k)\times k}$ for the code (n, k) from the parity matrix $P_{12\times 12}$ of the (24, 12) systematic extended Golay code.

The configuration of the encoder shown in FIG. 6 indicates the corresponding bit location, such as "LSB," of the k information bits in the codeword represented by the vector c, and indicates the corresponding bit location, such as "MSB," of the encoded parity portion in the codeword.

In one embodiment, and with reference to Table 3, where k information bits are to be encoded in a codeword having a fixed length of 20 bits, that is, n=20, and where the range of k is $8 \leq k \leq 12$, the code (20, k) is determined.

Table 3 shows the 12×12 parity matrix $P_{12\times 12}$ of the (24, 12) systematic extended Golay code. Therefore, to determine the parity matrix $\overline{P}_{(20-k)\times k}$ for the code (20, k), the first (20-k) rows and the first k columns of the parity matrix $P_{12\times 12}$ of the (24, 12) systematic extended Golay code are selected.

bits to be encoded is 11, that is, k=11, the code (20, 11) must be determined. In the code (20, 11), the systematic portion is configured by 11 bits as the message bits and the parity portion is configured as an (n−k)×k parity matrix that is a subset of the parity matrix $P_{12\times 12}$ of the (24, 12) extended systematic Golay code.

Therefore, for the code (20, 11), a 9×11 parity matrix comprising (20-11) rows and 11 columns is determined by selecting the first 9 rows (from top to bottom in Table 3) and the first 11 columns (from left to right in Table 3) of the parity matrix $P_{12\times 12}$ of the (24, 12) systematic extended Golay code as indicated by the shaded region in Table 3.

In one embodiment, and with reference to Table 4, where k information bits are to be encoded in a codeword having a fixed length of 20 bits, that is, n=20, and where the range of k is $1 \leq k \leq 14$, the code (20, k) is determined.

TABLE 3

|  | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| $\overline{P}_{(20-k)\times k}$ | 0 | 1 | 1 | 1 | 1 | 1 | 1 | 1 | 1 | 1 | 1 | 1 |
|  | 1 | 1 | 1 | 0 | 1 | 1 | 1 | 0 | 0 | 0 | 1 | 0 |
|  | 1 | 1 | 0 | 1 | 1 | 1 | 0 | 0 | 0 | 1 | 0 | 1 |
|  | 1 | 0 | 1 | 1 | 1 | 0 | 0 | 0 | 1 | 0 | 1 | 1 |
|  | 1 | 1 | 1 | 1 | 0 | 0 | 0 | 1 | 0 | 1 | 1 | 0 |
|  | 1 | 1 | 1 | 0 | 0 | 0 | 1 | 0 | 1 | 1 | 0 | 1 |
|  | 1 | 1 | 0 | 0 | 0 | 1 | 0 | 1 | 1 | 0 | 1 | 1 |
|  | 1 | 0 | 0 | 0 | 1 | 0 | 1 | 1 | 0 | 1 | 1 | 1 |
|  | 1 | 0 | 0 | 1 | 0 | 1 | 1 | 0 | 1 | 1 | 1 | 0 |
|  | 1 | 0 | 1 | 0 | 1 | 1 | 0 | 1 | 1 | 1 | 0 | 0 |
|  | 1 | 1 | 0 | 1 | 1 | 0 | 1 | 1 | 1 | 0 | 0 | 0 |
|  | 1 | 0 | 1 | 1 | 0 | 1 | 1 | 1 | 0 | 0 | 0 | 1 |

For example, and with reference to Table 3, to determine the code (20, k) where the number of information bits to be encoded is 8, that is, k=8, the code (20, 8) is determined. In the code (20, 8), the systematic portion is configured by 8 bits as the message bits and the parity portion is configured as an (n−k)×k parity matrix that is a subset of the parity matrix $P_{12\times 12}$ of the (24, 12) systematic extended Golay code.

Therefore, for the code (20, 8), a 12×8 parity matrix comprising (20-8) rows and 8 columns is determined by selecting the first 12 rows (from top to bottom in Table 3) and first 8 columns (from left to right in Table 3) of the parity matrix $P_{12\times 12}$ of the (24, 12) extended systematic Golay code as indicated by the dotted region in Table 3.

It should be understood that the parity matrix $P_{12\times 12}$ of the (24, 12) extended systematic Golay code has the same performance even when the locations of the rows and columns are changed. The type of parity matrix $P_{12\times 12}$ corresponding to the maximum size of Table 3 can be varied. Accordingly, although the (20−k) rows are taken from the upper side of $P_{12\times 12}$ and the k columns are taken from the lower side of $P_{12\times 12}$ at the time of the configuration of the $\overline{P}_{(20-k)\times k}$ parity matrix, the original matrix, that is, the original $P_{12\times 12}$, may be changed so as to generate various types of $\overline{P}_{(20-k)\times k}$. However, to maintain brevity, all of the possible types of the parity matrix $\overline{P}_{(20-k)\times k}$ are not described herein.

As another example, and with reference to Table 3, to determine the code (20, k) where the number of information Where the number of k information bits to be encoded is variable, a new (n, k) systematic code must typically be generated for the desired values of k to achieve optimal results.

However, the design of a new (n, k) systematic code for various values of k is difficult. Moreover, it is difficult to modify an encoder of a transmitter and a decoder of a receiver according to the number of message bits. Therefore, to avoid the difficulties involved in the generation of such a new (n, k) systematic code, the encoding method of the present invention generates the (n, k) systematic code using the (24, 12) extended systematic Golay code with a maximum portion common to all the (n, k) codes as much as possible. In other words, the encoding method of the present invention generates the (n, k) systematic code by determining an appropriate small parity matrix nested within a large parity matrix.

TABLE 4

| k | $\overline{P}_{(20-k)\times k}$ |
|---|---|
| 1 | 19 × 1 |
| 2 | 18 × 2 |
| 3 | 17 × 3 |
| 4 | 16 × 4 |
| 5 | 15 × 5 |
| 6 | 14 × 6 |
| 7 | 13 × 7 |
| 8 | 12 × 8 |
| 9 | 11 × 9 |

TABLE 4-continued

| k | $\overline{P}_{(20-k) \times k}$ |
|---|---|
| 10 | 10 × 10 |
| 11 | 9 × 11 |
| 12 | 8 × 12 |
| 13 | 7 × 13 |
| 14 | 6 × 14 |

The parity matrix $\overline{P}_{(20-k) \times k}$ for the code (20, k) is an (n−k)×k parity matrix. The size of the required parity matrix $\overline{P}_{(20-k) \times k}$ corresponding to each possible value of k within the range 1≦k≦14, is provided in Table 4.

Since the maximum size of the parity matrix $P_{12 \times 12}$ which can be obtained from the (24, 12) extended systematic Golay code is a 12×12 parity matrix, the parity matrix $P_{12 \times 12}$ of the (24, 12) extended systematic Golay code can be used to determine the parity matrix $\overline{P}_{(20-k) \times k}$ for values of k within the range 8≦k≦12. In other words, the parity bits may be taken from the parity matrix $P_{12 \times 12}$ of the (24, 12) extended systematic Golay code according to the value of k within the range 8≦k≦12.

However, for values of k within the range 1≦k≦7 or 13≦k≦14, additional parity bits are generated and thus the parity matrix $P_{12 \times 12}$ of the (24, 12) extended systematic Golay code is expanded as shown in Table 5.

For values of k within the range 1≦k≦7 or 13≦k≦14, additional parity bits are required at the locations indicated by the shaded regions in Table 5. For example, the additional parity bits for the code (20, k) can be generated by an exhaustive search process performed by a computer, the result of which is shown in Table 6. The design is performed such that the minimum distance is maximized in each of the given sizes. In Table 6, uninterested parts which are not considered when finding additional parity parts, such as the non-shaded regions in Table 5, are filled with 0 for the convenience of notation.

Figure 7:
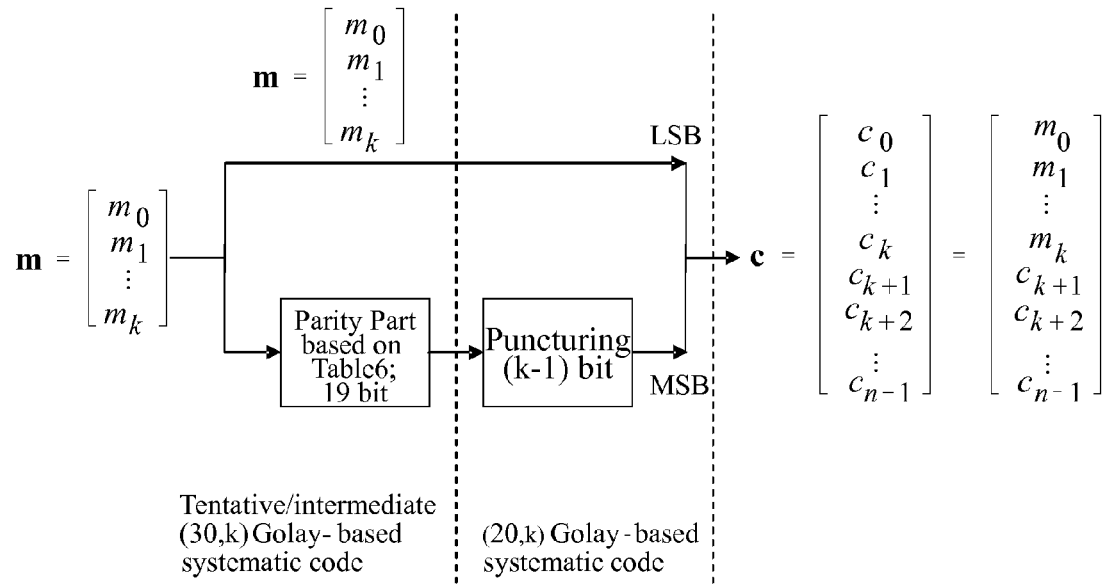
FIG. 7 is a block diagram of an encoder for performing the method of the present invention.

In one embodiment, the encoding method of the present invention includes generating the parity portion by the length of 19 bits which is the maximum parity length regardless of the number of message bits based on Table 6 and performing puncturing by the (k−1) bit number so as to adjust the bit number of the codeword to 20 bits. The puncturing is performed by cutting the back of the parity. The method of the present embodiment can be performed, for example, by the encoder shown in FIG. 7.

In another embodiment, the encoding method of the present invention includes selecting a necessary parity matrix from Table 6 for the number of message bits and generating the parity portion using the selected matrix.

For example, if the number of message bits to be encoded is 7, the size of the necessary parity matrix $\overline{P}_{(20-k) \times k}$ is 13×7.

TABLE 5

| | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| | 1 | 0 | 1 | 1 | 0 | 1 | 1 | 1 | 0 | 0 | 0 | 1 | | |
| | 1 | 1 | 0 | 1 | 1 | 0 | 1 | 1 | 1 | 0 | 0 | 0 | | |
| | 1 | 0 | 1 | 0 | 1 | 1 | 0 | 1 | 1 | 1 | 0 | 0 | | |
| | 1 | 0 | 0 | 1 | 0 | 1 | 1 | 0 | 1 | 1 | 1 | 0 | | |
| | 1 | 0 | 0 | 0 | 1 | 0 | 1 | 1 | 0 | 1 | 1 | 1 | | |
| | 1 | 1 | 0 | 0 | 0 | 1 | 0 | 1 | 1 | 0 | 1 | 1 | | |
| | 1 | 1 | 1 | 0 | 0 | 0 | 1 | 0 | 1 | 1 | 0 | 1 | | |
| $\overline{P}_{(20-k) \times k}$ | 1 | 1 | 1 | 1 | 0 | 0 | 0 | 1 | 0 | 1 | 1 | 0 | | |
| | 1 | 0 | 1 | 1 | 1 | 0 | 0 | 0 | 1 | 0 | 1 | 1 | | |
| | 1 | 1 | 0 | 1 | 1 | 1 | 0 | 0 | 0 | 1 | 0 | 1 | | |
| | 1 | 1 | 1 | 0 | 1 | 1 | 1 | 0 | 0 | 0 | 1 | 0 | | |
| | 0 | 1 | 1 | 1 | 1 | 1 | 1 | 1 | 1 | 1 | 1 | 1 | | |

In Table 5, the original parity matrix $P_{12 \times 12}$ of the (24, 12) extended systematic Golay code is indicated by the region within the dotted lines. As discussed above, for values of k within the range 8≦k≦12, the parity matrix $P_{12 \times 12}$ of the (24, 12) extended systematic Golay code can be used to determine the parity matrix $\overline{P}_{(20-k) \times k}$ of the code (20, k).

Figure 8:
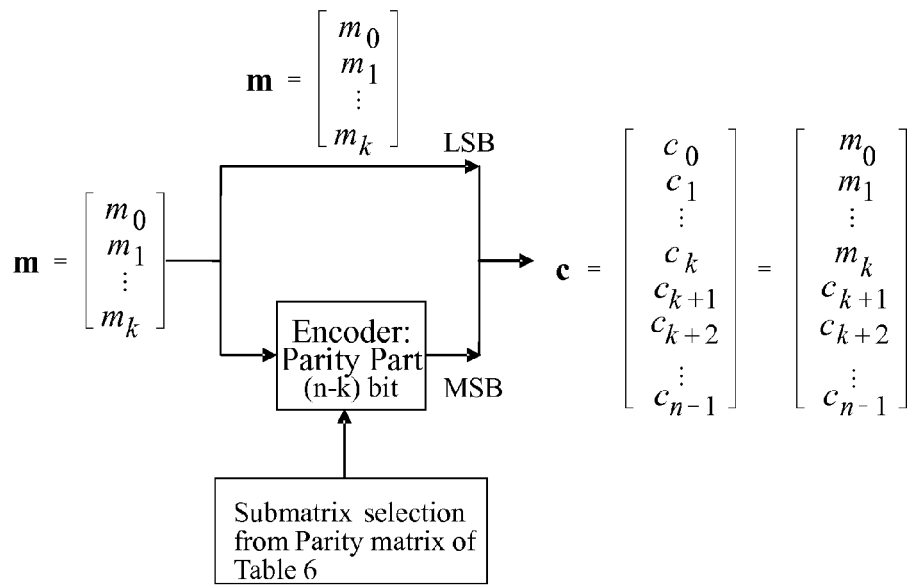
FIG. 8 is a block diagram of another encoder for performing the method of the present invention.

The parity matrix $\overline{P}_{13 \times 7}$ is obtained by selecting 13 rows from top to bottom of Table 6 and selecting seven columns from the left side to the right side of Table 6. The selected parity matrix is indicated by the shaded region in Table 6. The method of the present embodiment can be performed, for example, by the encoder shown in FIG. 8.

TABLE 6

| | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| $\overline{P}_{(20-k)\times k}$ | 1 | 0 | 1 | 1 | 0 | 1 | 1 | 1 | 0 | 0 | 0 | 1 | 0 | 1 |
| | 1 | 1 | 0 | 1 | 1 | 0 | 1 | 1 | 1 | 0 | 0 | 0 | 1 | 0 |
| | 1 | 0 | 1 | 0 | 1 | 1 | 0 | 1 | 1 | 1 | 0 | 0 | 1 | 0 |
| | 1 | 0 | 0 | 1 | 0 | 1 | 1 | 0 | 1 | 1 | 1 | 0 | 0 | 1 |
| | 1 | 0 | 0 | 0 | 1 | 0 | 1 | 1 | 0 | 1 | 1 | 1 | 0 | 1 |
| | 1 | 1 | 0 | 0 | 0 | 1 | 0 | 1 | 1 | 0 | 1 | 1 | 0 | 0 |
| | 1 | 1 | 1 | 0 | 0 | 0 | 1 | 0 | 1 | 1 | 0 | 1 | 1 | 0 |
| | 1 | 1 | 1 | 1 | 0 | 0 | 0 | 1 | 0 | 1 | 1 | 0 | 0 | 0 |
| | 1 | 0 | 1 | 1 | 1 | 0 | 0 | 0 | 1 | 0 | 1 | 1 | 0 | 0 |
| | 1 | 1 | 0 | 1 | 1 | 1 | 0 | 0 | 0 | 1 | 0 | 1 | 0 | 0 |
| | 1 | 1 | 1 | 0 | 1 | 1 | 1 | 0 | 0 | 0 | 1 | 0 | 0 | 0 |
| | 0 | 1 | 1 | 1 | 1 | 1 | 1 | 1 | 1 | 1 | 1 | 1 | 0 | 0 |
| | 1 | 1 | 1 | 0 | 1 | 1 | 1 | 0 | 0 | 0 | 0 | 0 | 0 | 0 |
| | 1 | 1 | 0 | 1 | 1 | 1 | 0 | 0 | 0 | 0 | 0 | 0 | 0 | 0 |
| | 1 | 0 | 1 | 1 | 1 | 0 | 0 | 0 | 0 | 0 | 0 | 0 | 0 | 0 |
| | 0 | 1 | 1 | 1 | 0 | 0 | 0 | 0 | 0 | 0 | 0 | 0 | 0 | 0 |
| | 1 | 1 | 1 | 0 | 0 | 0 | 0 | 0 | 0 | 0 | 0 | 0 | 0 | 0 |
| | 1 | 1 | 0 | 0 | 0 | 0 | 0 | 0 | 0 | 0 | 0 | 0 | 0 | 0 |
| | 1 | 0 | 0 | 0 | 0 | 0 | 0 | 0 | 0 | 0 | 0 | 0 | 0 | 0 |

Figure 9:
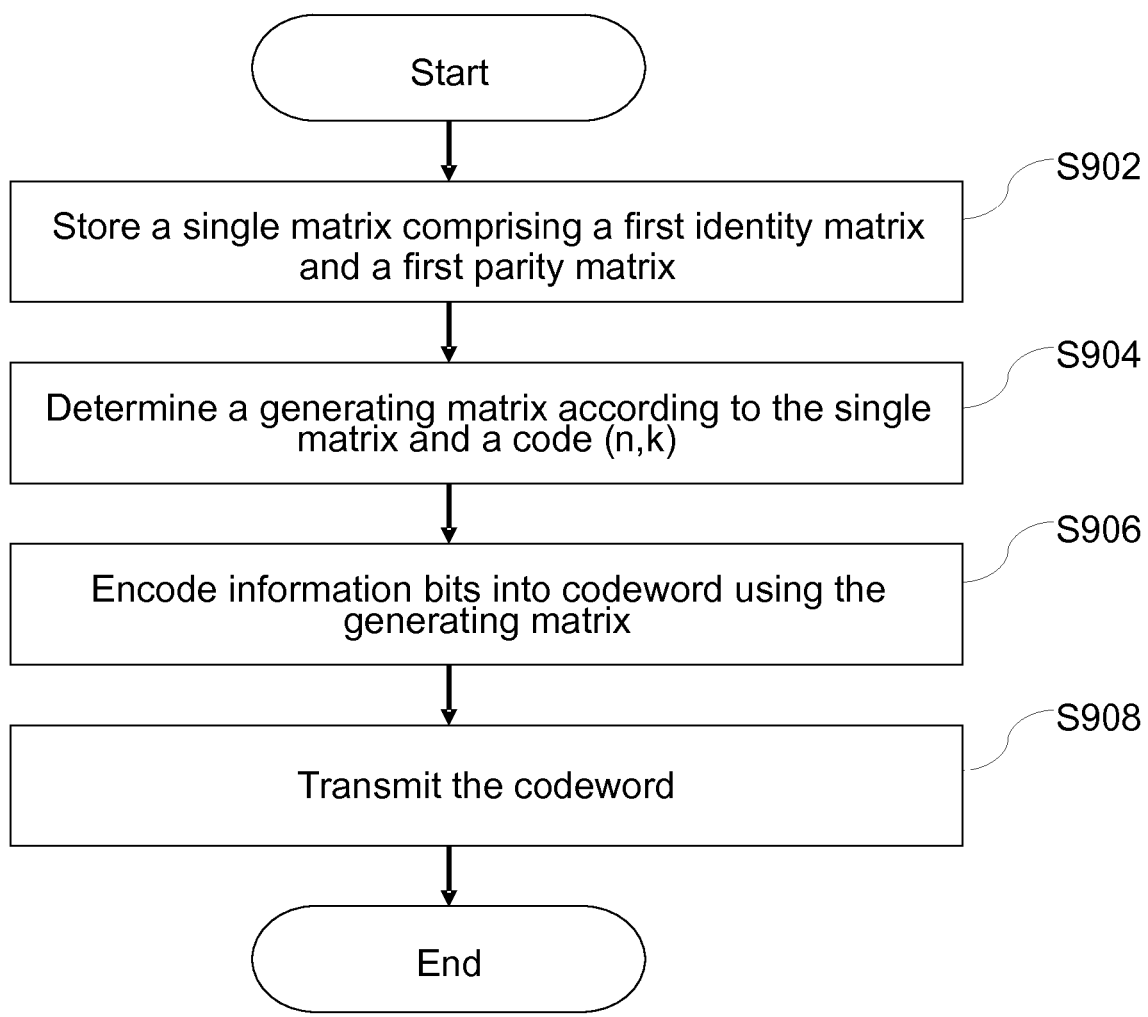
FIG. 9 is a flow chart of a method of coding information for transmission in a mobile communication system according to one embodiment of the present invention.

FIG. 9 illustrates a flow chart of a method of coding information for transmission in a mobile communication system in accordance with one embodiment of the present invention. As shown in FIG. 9, a single matrix comprising a first identity matrix having r rows and c columns and a first parity matrix having s rows and t columns is stored (S 902). A generating matrix according to the single matrix and a code (n, k) is determined, where the generating matrix comprises a second identity matrix having equal to or less than r rows and equal to or less than c columns and a second parity matrix having equal to or less than s rows and equal to or less than t columns (S 904).

The information bits are then encoded into a codeword using the generating matrix, where a number of coded bits per codeword is n and a number of information bits coded to generate each codeword is k (S 906). Thereafter, the codeword is transmitted (S 908). Therefore, second identity matrix is a subset of the first identity matrix, the second parity matrix is a subset of the first parity matrix and the second identity matrix and the second parity matrix are based on n and k.

Figure 10:
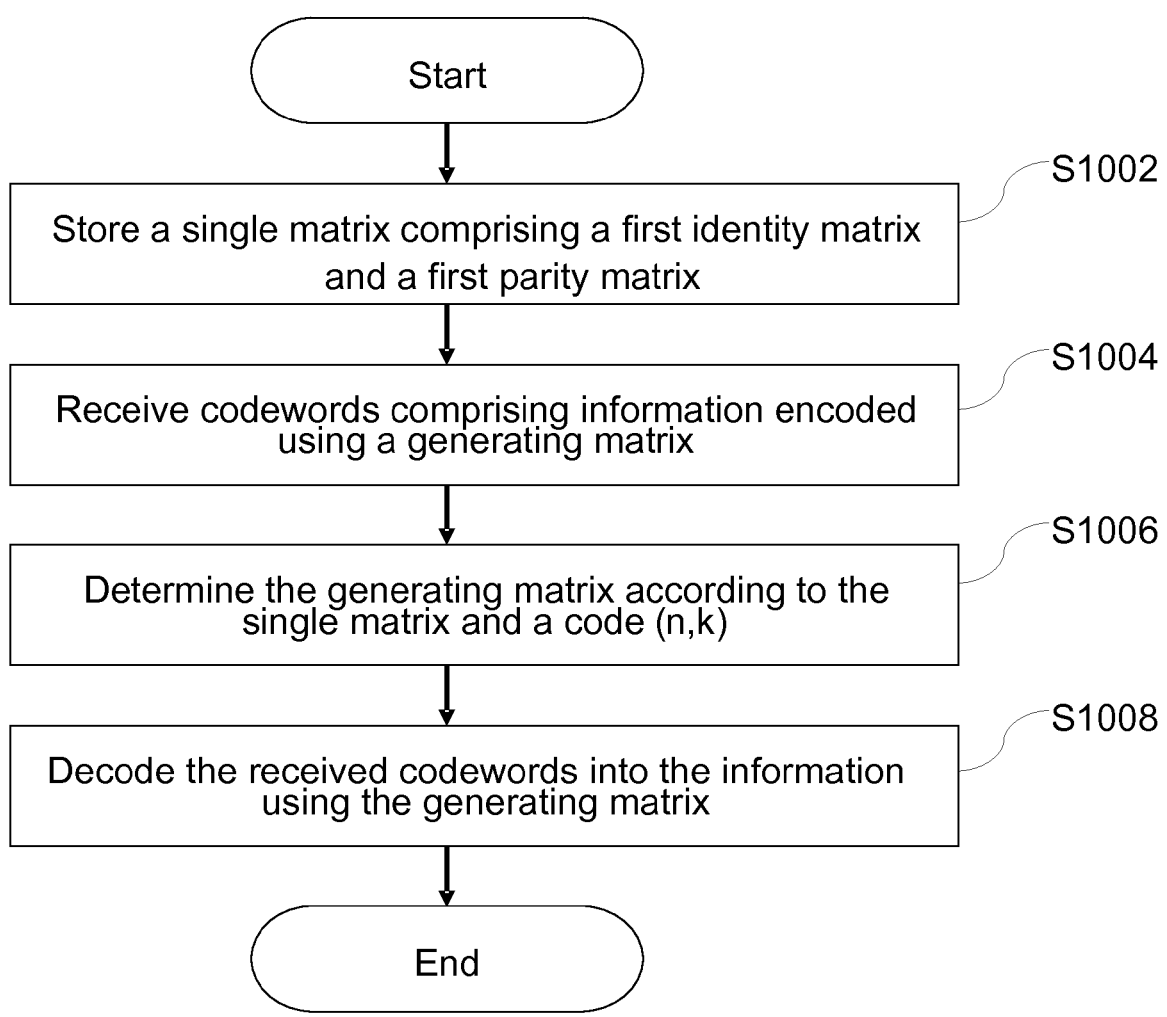
FIG. 10 is a flowchart of a method of receiving coded information in a mobile communication system according to one embodiment of the present invention.

FIG. 10 illustrates a flowchart of a method of receiving coded information in a mobile communication system in accordance with one embodiment of the present invention. As shown in FIG. 10, a single matrix comprising a first identity matrix having r rows and c columns and a first parity matrix having s rows and t columns is stored (S 1002). Code words comprising information encoded using a generating matrix is received (S 1004).

The generating matrix according to the single matrix and a code (n, k) is then determined, the generating matrix comprising a second identity matrix having equal to or less than r rows and equal to or less than c columns and a second parity matrix having equal to or less than s rows and equal to or less than t columns (S 1006). Thereafter, the received code words are decoded into the information using the generating matrix, wherein a number of coded bits per codeword is n and a number of information bits coded to generate each codeword is k (S 1008). Therefore, the second identity matrix is a subset of the first identity matrix, the second parity matrix is a subset of the first parity matrix and the second identity matrix and the second parity matrix are based on n and k.

According to another embodiment, the coding method of the present invention is based on a (20, 10) block code and is configured to support various combinations of (20−m, 10+n). For example, m and n can be positive or negative integers. For example, m may be any one of integers between 0 and 4, and n may be any one of integers between −5 and 2.

The encoding method of the present embodiment uses the (24, 12) systematic extended Golay code as a basic code for designing the block codes. The (24, 12) Golay code is acquired by extending the (23, 12) quadratic residue code, that is, an original Golay code, having a minimum Hamming distance of "7." Specifically, the (24, 12) Golay code has a minimum Hamming distance of "8." The (24, 12) Golay code is one of the longest minimum Hamming distances among those of several codes, each of which has the length of 24 and the dimension of 12.

The code, such as the Golay code, having both a short length and a superior Hamming distance can be applied to an error correction technique for control information in the next-generation mobile communication system. The Golay code satisfies a number of requirements needed for coding the control information of the mobile communication system. In particular, the Golay code has superior error correction capability and a short length. As will be described below, codes having a variety of lengths and dimensions can be acquired from the Golay code.

Table 7 shows each row of the 12×24 generator matrix of the (24, 12) systematic extended Golay code. More specifically, Table 7 shows each basis of the 12×24 generator matrix of the (24, 12) systematic extended Golay code.

The above-mentioned bases of Table 1 are configured for a systematic Golay code. A method for generating new codes from the systematic Golay code according to the present invention will hereinafter be described in detail.

TABLE 7

| Index | Generator matrix |
|---|---|
| m[1] | [1, 0, 0, 0, 0, 0, 0, 0, 0, 0, 0, 0, 1, 1, 1, 1, 1, 1, 1, 1, 1, 1, 1, 1] |
| m[2] | [0, 1, 0, 0, 0, 0, 0, 0, 0, 0, 0, 0, 1, 1, 1, 0, 1, 1, 1, 0, 0, 0, 1, 0] |
| m[3] | [0, 0, 1, 0, 0, 0, 0, 0, 0, 0, 0, 0, 1, 1, 0, 1, 1, 1, 0, 0, 0, 1, 0, 1] |
| m[4] | [0, 0, 0, 1, 0, 0, 0, 0, 0, 0, 0, 0, 1, 0, 1, 1, 1, 0, 0, 0, 1, 0, 1, 1] |
| m[5] | [0, 0, 0, 0, 1, 0, 0, 0, 0, 0, 0, 0, 1, 1, 1, 1, 0, 0, 0, 1, 0, 1, 1, 0] |
| m[6] | [0, 0, 0, 0, 0, 1, 0, 0, 0, 0, 0, 0, 1, 1, 1, 0, 0, 0, 1, 0, 1, 1, 0, 1] |
| m[7] | [0, 0, 0, 0, 0, 0, 1, 0, 0, 0, 0, 0, 1, 1, 0, 0, 0, 1, 0, 1, 1, 0, 1, 1] |
| m[8] | [0, 0, 0, 0, 0, 0, 0, 1, 0, 0, 0, 0, 1, 0, 0, 0, 1, 0, 1, 1, 0, 1, 1, 1] |
| m[9] | [0, 0, 0, 0, 0, 0, 0, 0, 1, 0, 0, 0, 0, 0, 1, 0, 1, 1, 0, 1, 1, 1, 1, 0] |
| m[10] | [0, 0, 0, 0, 0, 0, 0, 0, 0, 1, 0, 0, 1, 0, 1, 0, 1, 1, 0, 1, 1, 1, 0, 0] |
| m[11] | [0, 0, 0, 0, 0, 0, 0, 0, 0, 0, 1, 0, 1, 1, 0, 1, 1, 0, 1, 1, 1, 0, 0, 0] |
| m[12] | [0, 0, 0, 0, 0, 0, 0, 0, 0, 0, 0, 1, 1, 0, 1, 1, 0, 1, 1, 1, 0, 0, 0, 1] |

The code having various lengths n and various dimensions k can be effectively generated from the Golay code according to the following steps.

In a first step, (12−k) rows among rows of the generator matrix of the (24, 12) systematic extended Golay code are selectively removed, such that k bases are determined. In this case, the $i^{th}$ rows ($1 \leq i \leq 12$) of the generator matrix shown in Table 7 are removed, and the $i^{th}$ columns of the remaining bases are all zero. Therefore, although the above columns are removed, the removed result has no influence upon a Hamming distance between codes. Therefore, the first step includes the above process, i.e., the shortening process. By the above shortening process, the (24−(12−k), k)=(12+k, k) code, where $1 \leq k \leq 12$, can be acquired. The (24−(12−k), k) code (or the 12+k, k) code) maintains a minimum Hamming distance "8" from the original (24, 12) Golay code.

In a second step, the Hamming weight distribution of the (12+k, k) code acquired from the first step is examined.

In a third step, in association with the predetermined value k, a different pattern for removing the rows of the generator matrix is used, and at the same time the above first and second steps are repeatedly applied to the different pattern, such that a code having an optimum Hamming weight distribution and a row-removing pattern corresponding to the code are selected. The optimum Hamming weight distribution achieves a minimum number of code words having a short Hamming distance therebetween.

After the optimum row-removing pattern is applied to the generator matrix of the Golay code, the following optimum column-removing pattern can be used.

In a fourth step, columns of the generator matrix of the systematic (12+k, k) code acquired from the third step are selectively removed. In other words, the (12+k−n) columns are additionally removed from columns corresponding to a parity part, such that the last code of length n can be acquired. In this case, columns 1 through 12 indicating the systematic information are not removed.

In a fifth step, the Hamming weight distribution of the (n, k) code acquired from the fourth step is examined.

In the last step, in association with the predetermined variables n and k, a different pattern for removing rows and columns of the generator matrix is used, the fourth and fifth steps are repeatedly applied to this changed result, and at the same time the above first and second steps are repeatedly applied to the different pattern, such that a code having an optimum Hamming weight distribution and a row-removing pattern corresponding to this code are selected. In this case, the optimum Hamming weight distribution achieves a minimum number of code words having a short Hamming distance therebetween.

The above-mentioned generation steps search for the optimum row-removing pattern from the generator matrix of the (24, 12) systematic extended Golay code, and search for the optimum column-removing pattern from the resulting generator matrix.

In removing columns from the generator matrix, the removing pattern is confined to only columns corresponding to a parity part of a generator matrix of a code having a superior Hamming weight distribution acquired by the reduction of (12−k) rows, such that a search space for searching for the row/column-removing patterns is reduced to search for a more effective and superior removing pattern.

Figure 11:
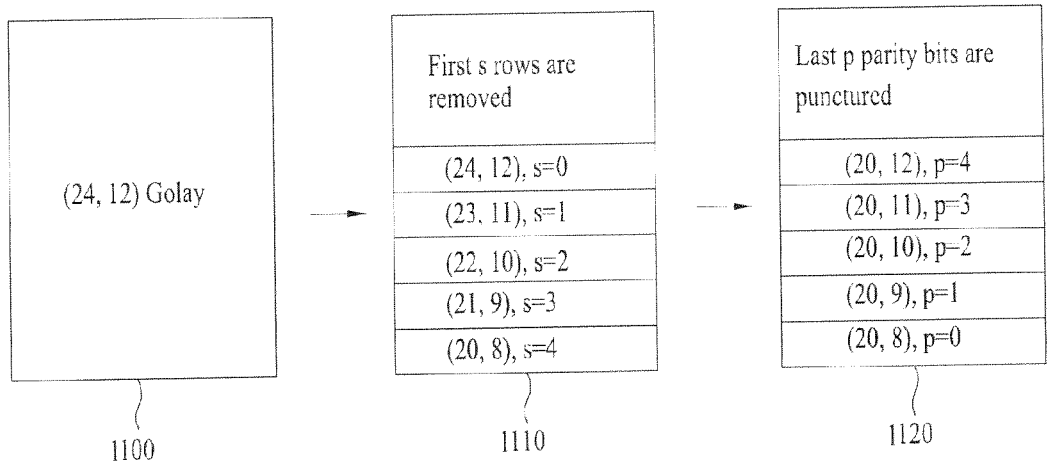
FIG. 11 is a conceptual diagram illustrating a method for generating block codes according to another embodiment of the present invention.

FIG. 11 is a conceptual diagram illustrating an exemplary method for generating block codes according to the present invention.

FIG. 11 shows an exemplary process for generating block codes on the condition that the n value is 20, that is, n=20, and the k value is set to $8 \leq k \leq 12$. If the row-removing method and the column-removing method are applied to the n and k values, the following result is acquired.

It should be understood that the code having the generator matrix acquired by removing (12−k) rows from the (24, 12) systematic extended Golay code 1100 shown in FIG. 11 always has the same Hamming weight distribution. Moreover, another code 1120 having a generator matrix acquired by removing the (12+k−n) columns corresponding to the parity of the acquired generator matrix according to an arbitrary pattern always has the same Hamming weight distribution.

Therefore, a method for generating the code having the n and k values from the (24, 12) systematic extended Golay code can be summarized as follows. The generator matrixes acquired by the reduction of s columns of the (24, 12) systematic Golay code of the (24, 12) Golay code always provide the same Hamming weight distribution.

FIG. 11 shows an exemplary row-removing method in accordance with one embodiment of the present invention. The reference numeral 1110 of FIG. 11 removes the first s rows. Therefore, although the s rows of the (24, 12) systematic Golay code are removed, the code having the same parameter as that of the original Golay code can be acquired. In this way, if arbitrary p columns corresponding to a parity part of a generator matrix acquired by the reduction of the s rows are removed, the acquired generator matrixes provide the same Hamming weight distribution at all times.

The result 1120 acquired by the reduction of the last p parities may be used as an exemplary column-removing method. Therefore, although the p columns corresponding to the parity part of each generator matrix acquired by the reduction of the s rows are removed, the code having the same parameter can be acquired.

Figure 12:
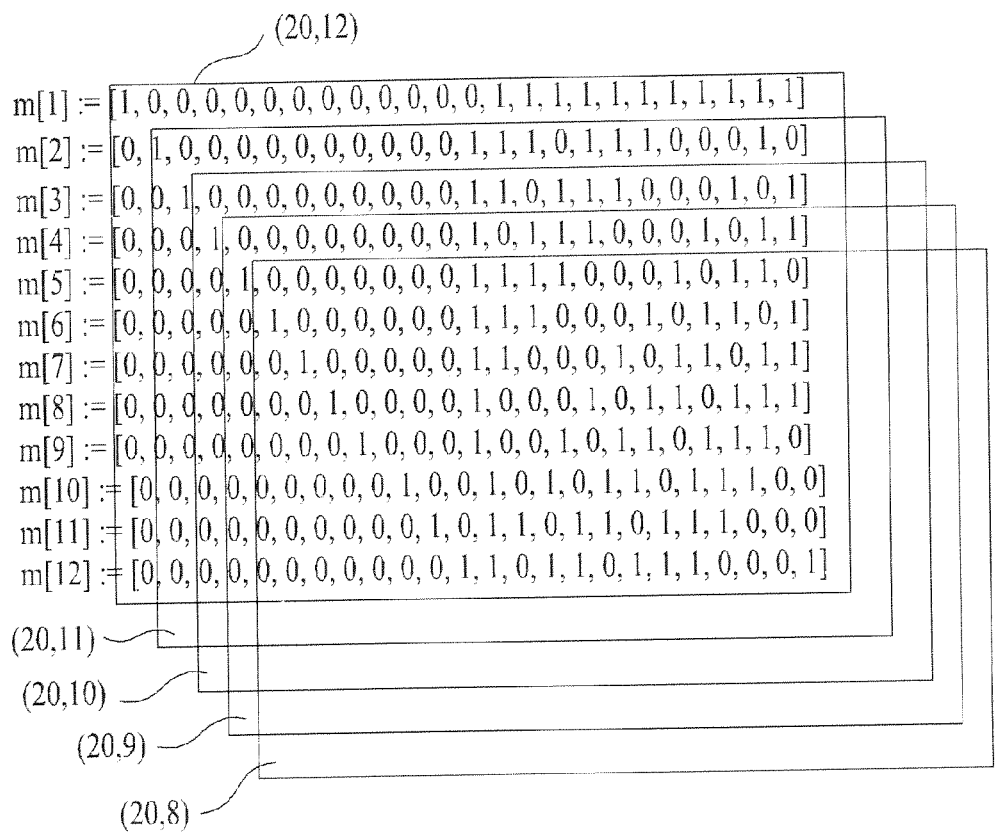
FIG. 12 illustrates block codes generated by the method of FIG. 11.

FIG. 12 illustrates block codes generated by the method of FIG. 11 in accordance with one embodiment of the present invention.

As shown in FIG. 12, when the last four columns are successively removed from the generator matrix of the (24, 12) code, the (20, 12) code is acquired; when the first row is removed from the generator matrix of the (24, 12) code and then the first three columns and the last three columns are successively removed from the removed result, the (20, 11) code is acquired; when the first two rows are removed from the generator matrix of the (24, 12) code and then the first two columns and the last two columns are successively removed from the removed result, the (20, 10) code is acquired; when the first three rows are removed from the generator matrix of the (24, 12) code and the first three columns and the last column are removed from the removed result, the (20, 9) code is acquired; and when the first four rows are removed from the generator matrix of the (24, 12) code and then the first four columns are removed from the removed result, the (20, 8) code is acquired.

Figure 13:
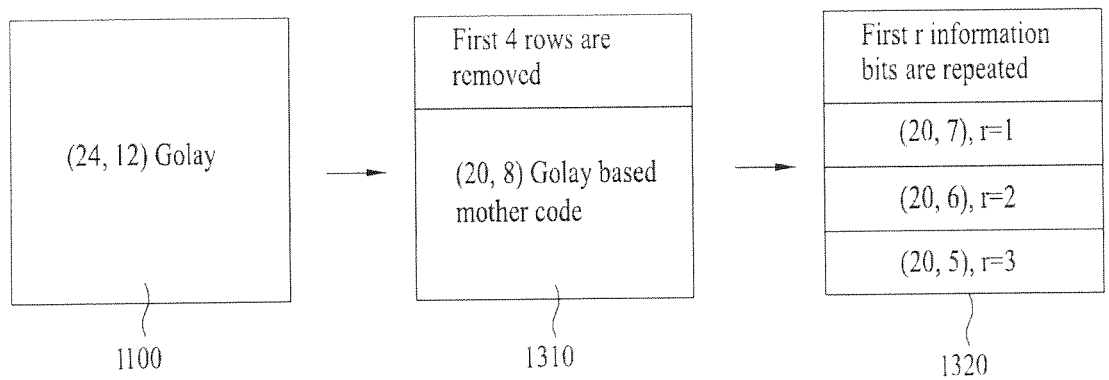
FIG. 13 is a conceptual diagram illustrating another method for generating block codes according to another embodiment of the present invention.

FIG. 13 is a conceptual diagram illustrating another method for generating block codes in accordance with one embodiment of the present invention.

For example, as shown in FIG. 13, if the n value is 20, that is, n=20, and the k value is 5≦k≦7, the (20, 8) code of FIG. 11 corresponding to the k value is set to a basic code. In FIG. 13, the (20, 8) code 310 acquired when the first four columns are removed from the Golay code is set to a basic code.

In this case, the block code for the coding needs 8 input signals, such that 8-k input bits among the k input bits are repeated, resulting in the generation of 8 input bits. In this case, the repeating of the input bits does not increase a minimum Hamming distance of the (20, 8) code, such that a minimum Hamming distance of the (20, k) code in association with the k value of 5≦k≦7 is equal to a minimum Hamming distance "8" of the (20, 8) code.

In FIG. 13, it should be noted that the repeating of r input signals 320 from the first bit among the input bits has been disclosed for only illustrative purposes. In this case, although the r input bits are repeated, the code having the same parameter can be generated. Also, where the r input bits are repeated, the repeated input bits vary in significance, and thus the input bits having high significance can be repeated.

Figure 14:
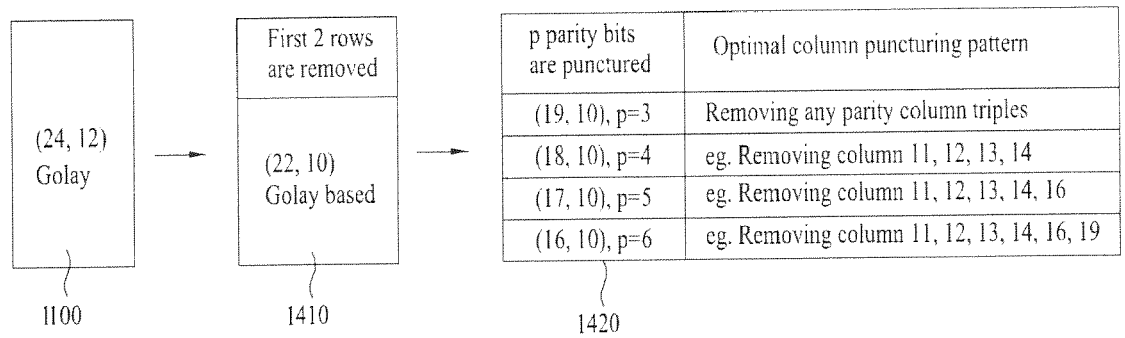
FIG. 14 is a conceptual diagram illustrating another method for generating block codes according to another embodiment of the present invention.

FIG. 14 shows a conceptual diagram illustrating still another method for generating block codes in accordance with one embodiment of the present invention.

As shown in FIG. 14, if the n value is 16≦n≦119 and the value of k is 10, that is, k=10, the (22, 10) code of FIG. 11 corresponding to the n value is set to a basic code, and the (22−n) columns are removed from the corresponding generator matrix, such that the (n, 10) code is generated.

In FIG. 14, the (22, 10) code 1410 acquired after removing the first 2 columns from the Golay code is set to a basic code.

In case of applying an exhaustive search to the (22, 10) code 1410, if the n value is 19, that is, n=19, it can be recognized that the generator matrix 1420 having a constant Hamming weight distribution according to an arbitrary removing pattern is acquired. However, if the n value is 16, 17, or 18, there is an additional optimum column removing pattern. The (22−n) columns are removed from the generator matrix of the given (22, 10) code according to an optimum column removing pattern, such that the code 1420 having the best Hamming weight distribution is generated.

An index of the column removed from an optimum column-puncturing pattern detected from each n value 16, 17, or 18 is a column index of the (22, 10) code. Furthermore, the optimum column-puncturing pattern shown in FIG. 14 is one of the removing patterns having the best Hamming weight distribution, and the number of such patterns in association with the n value may increase.

FIG. 15 illustrates the (19, 10) block code generated by the method of FIG. 14. In FIG. 15, the (19, 10) block code is acquired after removing the first two rows and then removing the first three columns from the parity portion.

FIG. 16 illustrates the (18, 10) block code generated by the method of FIG. 14. In FIG. 16, the (18, 10) block code is acquired after removing the first two rows and then removing the first four columns from the parity portion.

FIG. 17 illustrates the (17, 10) block code generated by the method of FIG. 14. In FIG. 17, the first two rows are removed and the first four columns and the sixth column of the parity portion are removed to generate the (17, 10) block code. In this case, an optimum column-removing pattern may exist. Optimum column removing patterns other than that of FIG. 7 can also be achieved.

FIG. 18 illustrates the (16, 10) block code generated by the method of FIG. 14. In FIG. 18, the first two rows are removed and the first four columns, the sixth column, and the ninth column of the parity portion are removed to generate the (16, 10) block code. In this case, an optimum column-removing pattern may exist. Optimum column removing patterns other than that of FIG. 8 can also be achieved.

Table 8 shows a minimum Hamming distance (dmin) among codes based on the embodiments of the present invention discussed above.

TABLE 8

| (n, k) | dmin |
|---|---|
| (20, 5) | 8 |
| (20, 6) | 8 |
| (20, 7) | 8 |
| (20, 8) | 8 |
| (20, 9) | 7 |
| (20, 10) | 6 |
| (20, 11) | 5 |
| (20, 12) | 4 |
| (19, 10) | 5 |
| (18, 10) | 4 |
| (17, 10) | 4 |
| (16, 10) | 4 |

Asymptotic bit error rate (BER) performances among codes are determined by a minimum Hamming distance and a code rate. Asymptotic BER performances calculated by the Hamming weight distribution of the codes having various n and k values are compared with each other.

Figure 19:
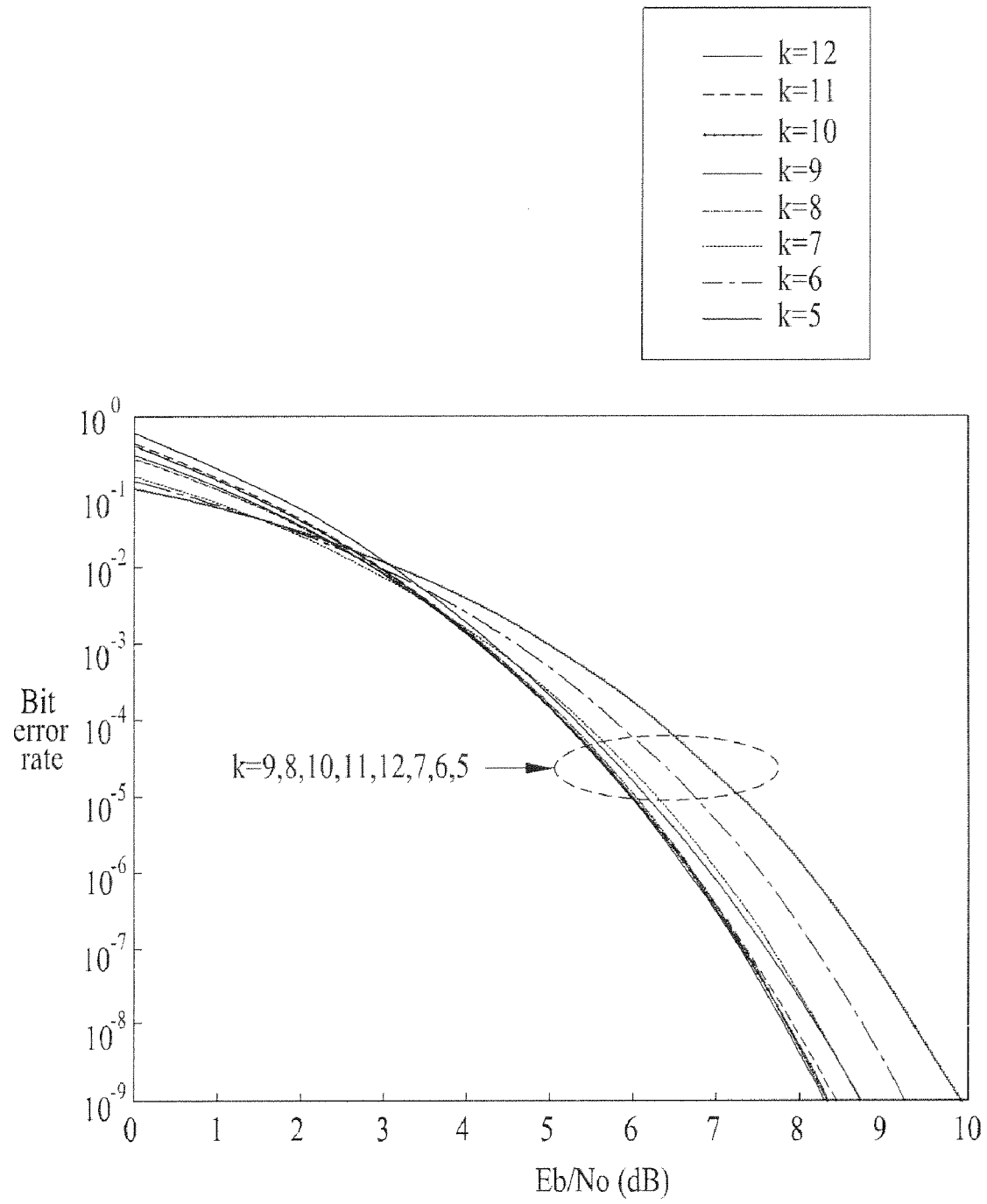
FIG. 19 is a graph illustrating the comparison of performances among block codes generated by the method of FIG. 11.

FIG. 19 is a graph illustrating the comparison of performances among block codes generated by the method of FIG. 11. The graph of FIG. 19 shows a comparison of the performances of the (20, k) code generated from the Golay code for values of k in the range 5≦k≦12.

If the k value is 5, 6, or 7, the performance of the (20, k) code may be deteriorated. However, if the BER value is 10-3, a difference in performance between block codes generated by the method of FIG. 11 may be reduced.

Figure 20:
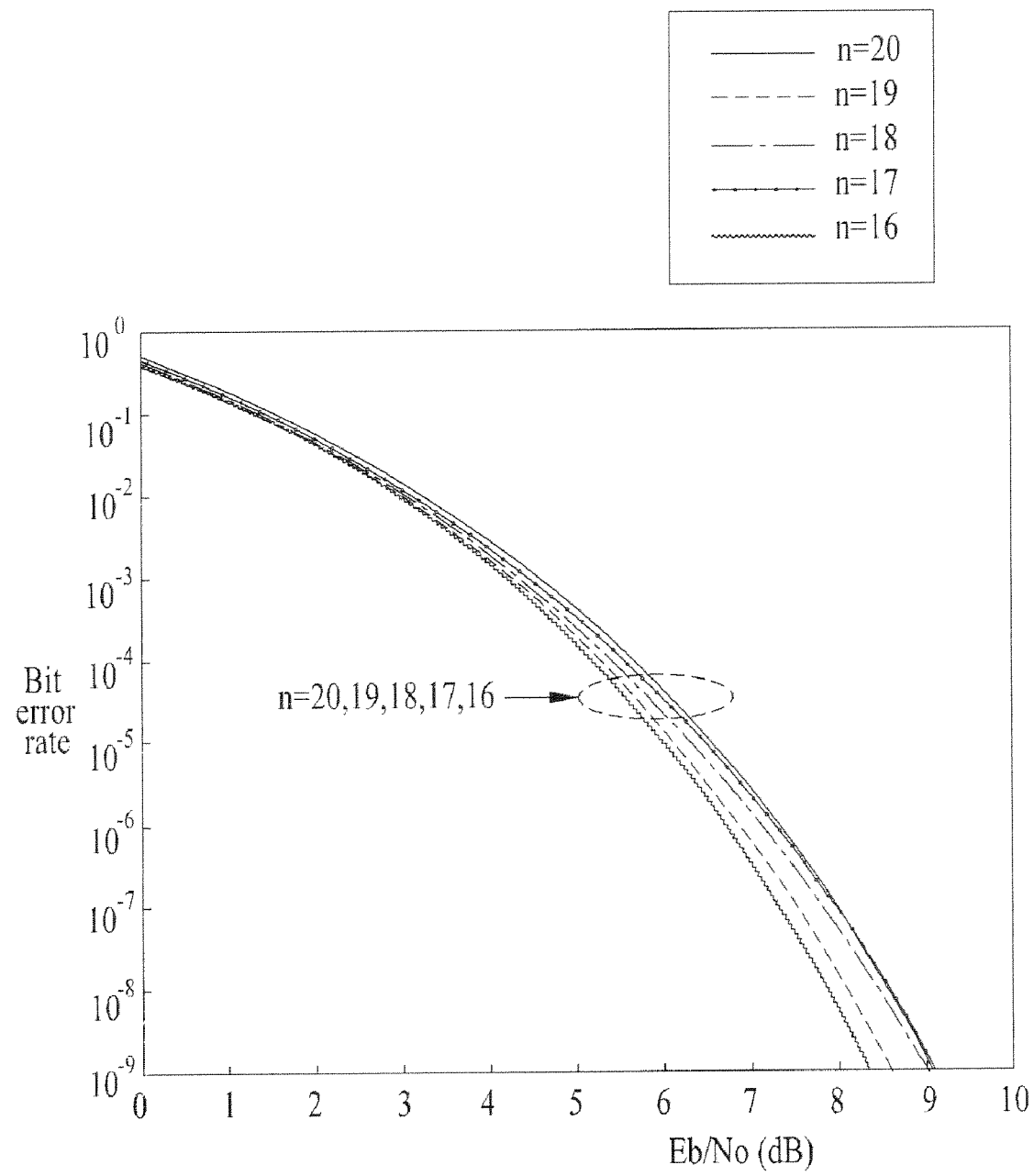
FIG. 20 is a graph illustrating the comparison of performances among block codes generated by the method of FIG. 14.

FIG. 20 is a graph illustrating the comparison of performances among block codes generated by the method of FIG. 14.

The graph of FIG. 20 shows a comparison of the performances of the (n, 10) code generated from the Golay code for values of n in the range 16≦n≦20. As shown in FIG. 20, although the n value is changed to another value, it can be recognized that there is little difference in performance among block codes. Specifically, if the BER value is 10-3, there is little difference in performance among the block codes.

Figure 21:
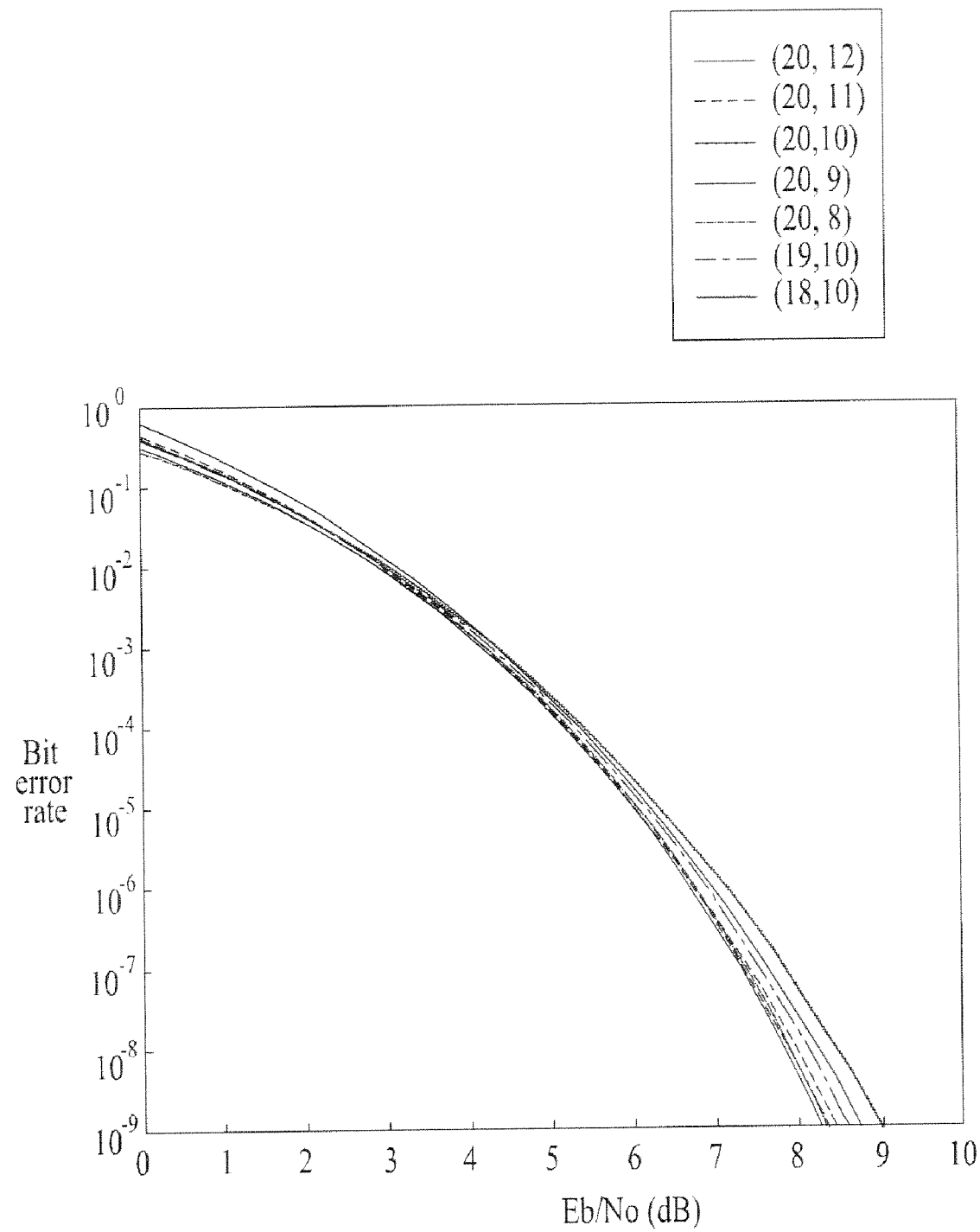
FIG. 21 is a graph illustrating the comparison of performances among block codes generated by the method of FIGS. 11 and 14.

FIG. 21 is a graph illustrating the comparison of performances among block codes generated by the method of FIGS. 11 and 14. If the n or k value is changed to another, there is little difference in performance among the block codes. Specifically, if the BER value is 10-3, there is little difference in performance among the block codes.

As can be seen from FIGS. 19 to 21, although a variety of block codes are generated from the Golay code according to the embodiments of the present invention, the superior coding performance can be maintained without any change.

Figure 22:
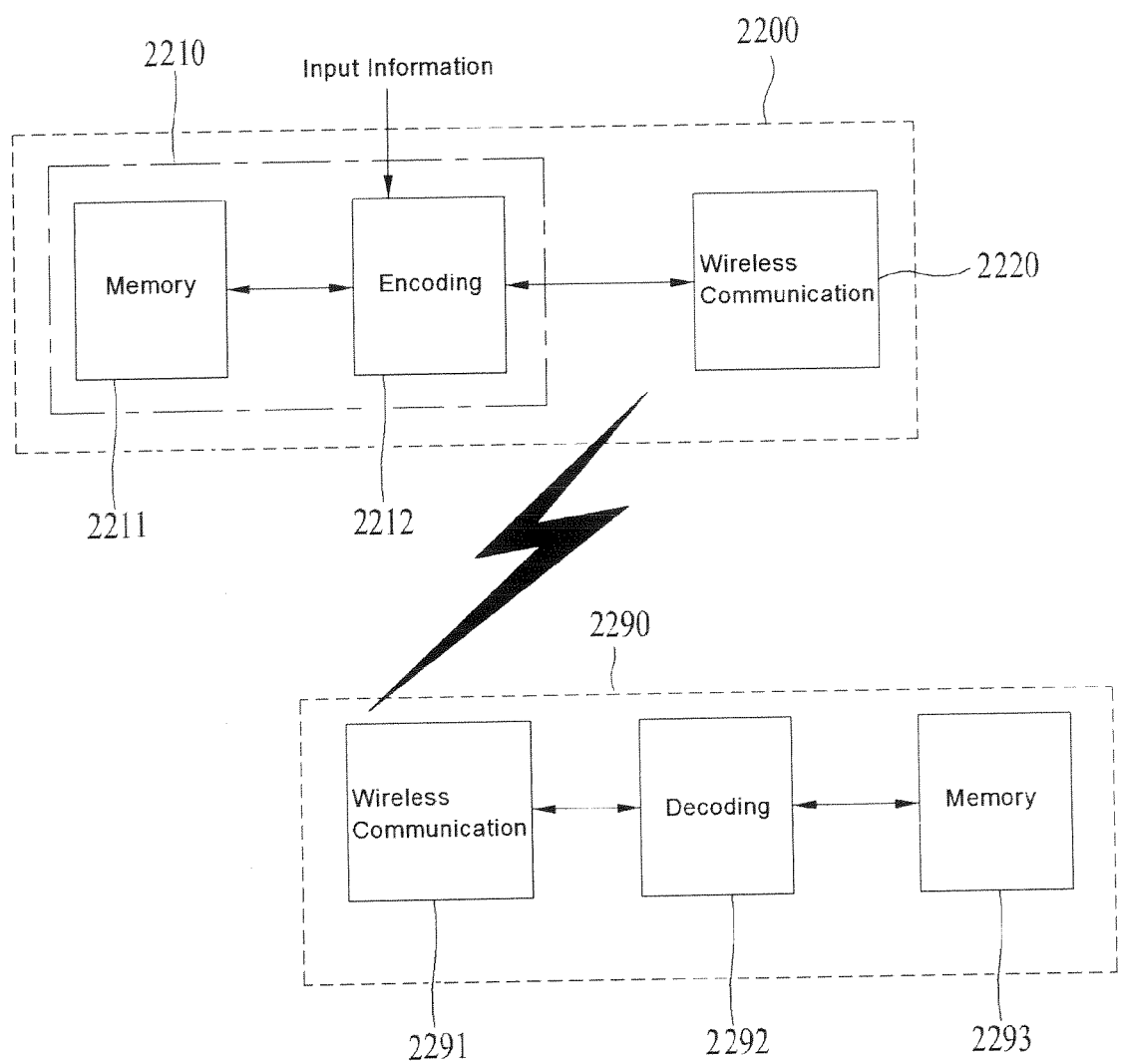
FIG. 22 is a block diagram illustrating a communication system including a data coding apparatus according to the present invention.

FIG. 22 is a block diagram of an exemplary communication system including a data coding apparatus according to one embodiment of the present invention. FIG. 22 includes a transmitter 2200 comprising an encoding unit 2210 and a wireless communication unit 2220. The encoding unit 2210 includes a memory unit 2211 and an encoder 2212.

The memory unit 2211 is configured to store a block code generated by the Golay code. The block code is generated after at least one row is removed from the generator matrix of the Golay code, and at least one column is removed from the parity portion of the generator matrix. In this case, the block code may be at least one of various codes generated by the above-mentioned embodiments. Preferably, the block code stored in the memory unit 2211 may have a minimum Hamming distance "8." Preferably, the block code stored in the memory unit 2211 may have a code length of 20 or less and an information bit number of 10 or less.

The encoder 2212 is configured to extract columns corresponding to the input information of the block code stored in the memory unit 2211 and to generate a bit stream related to the input information using the extracted columns.

As shown in FIG. 22, the receiver 2290 includes a wireless communication unit 2291, a decoding unit 2292, and a memory unit 2293.

The wireless communication unit 2291 receives data encoded into the block code from the transmitter 2210. The decoding unit 2292 decodes the encoded data. The memory unit 2293 may include necessary information, such as information associated with the block code used by the transmitter 2210, to enable the decoding unit 2292 to perform the decoding operation.

The present embodiment starts from the generator matrix of the (24, 12) systematic Golay code, and considers various row/column removing patterns. If the various row/column removing patterns are considered in a new matrix acquired when the row/column permutations are applied to the generator matrix of the (24, 12) systematic Golay code, the considering of the row/column removing patterns may be identical with that of the present invention due to characteristics of the block code, such that this considering action may be contained in the scope of the present invention.

As apparent from the above description, the present invention can be applied to a block code generation algorithm for effectively generating codes, which have various lengths and dimensions as well as superior Hamming weight distribution, and an apparatus associated with the block code generation algorithm. Also, the present invention can be applied to an encoding algorithm for encoding data, such as control information having various lengths, into codes having strong resistance to channel errors, and can also be applied to a variety of associated devices (e.g., a transmitter and a receiver) of a mobile communication system.

Although the present invention has been disclosed by referring to the above-mentioned embodiments, it should be noted that the aforementioned embodiments have been disclosed for only illustrative purposes, and those skilled in the art will appreciate that various modifications, additions and substitutions are possible, without departing from the scope and spirit of the invention as disclosed in the accompanying claims. Thus, it is intended that the present invention covers the modifications and variations of this invention provided they come within the scope of the appended claims and their equivalents.

Depending on implementation, it is possible that the present invention can take the form of an entirely hardware embodiment, an entirely software embodiment or an embodiment containing both hardware and software elements. A software embodiment may include, but not be limited to, firmware, resident software, microcode, etc.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims. Therefore, all changes and modifications that fall within the metes and bounds of the claims, or equivalence of such metes and bounds are intended to be embraced by the appended claims.

What is claimed is:

1. A method of coding information for transmission in a mobile communication system, the method comprising:
storing a single matrix comprising a first identity matrix having r rows and c columns and a first parity matrix having s rows and t columns;
determining a generating matrix according to the single matrix and a code (n, k), the generating matrix comprising a second identity matrix having equal to or less than r rows and equal to or less than c columns and a second parity matrix having equal to or less than s rows and equal to or less than t columns;
encoding information bits into codeword for transmission using the generating matrix, wherein a number of coded bits per codeword is n and a number of information bits coded to generate each codeword is k; and
transmitting the codeword,
wherein the second identity matrix is a subset of the first identity matrix, the second parity matrix is a subset of the first parity matrix and the second identity matrix and the second parity matrix are based on n and k.

2. The method of claim 1, wherein:
$12 \leq n \leq 24$,
k=12,
r=12,
c=12,
s=12, and
t=12.

3. The method of claim 1, wherein:
$n \leq 24$,
$n-12 \leq k \leq 12$,
r=12,
c=12,
s=12, and
t=12.

4. The method of claim 1, wherein:
n=20,
$1 \leq k \leq 14$,
r=14,
c=14,
s=19, and
t=14.

5. The method of claim 1, wherein the whole or part of single matrix is determined according to a systematic extended Golay code.

6. The method of claim 1, wherein the second parity matrix smaller than the first parity matrix is determined by puncturing at least a row or a column of the first parity matrix.

7. The method of claim 6, wherein a specific row or column that is punctured is determined between a transmitting entity and a receiving entity.

8. The method of claim 1, wherein the second identity matrix smaller than the first identity matrix is determined by puncturing at least a row or a column of the first identity matrix.

9. The method of claim 8, wherein a specific row or column that is punctured is determined between a transmitting entity and a receiving entity.

10. A method of coding information for transmission in a mobile communication system, the method comprising:
storing a single matrix having 24 rows and 12 columns and comprising a first identity matrix and a first parity matrix;
determining a generating matrix according to the single matrix and a code (n, k), the generating matrix having equal to or less than 24 rows and equal to or less than 12 columns and comprising a second identity matrix and a second parity matrix;
encoding information bits into code words for transmission using the generating matrix, wherein a number of coded bits per codeword is n and a number of information bits coded to generate each codeword is k; and
transmitting the code words,
wherein the second identity matrix is a subset of the first identity matrix, the second parity matrix is a subset of the first parity matrix and the second identity matrix and the second parity matrix are based on n and k.

11. The method of claim 10, wherein second parity matrix smaller than the first parity matrix is determined by puncturing at least a row or a column of the first parity matrix.

12. The method of claim 11, wherein a specific row or column that is punctured is determined between a transmitting entity and a receiving entity.

13. The method of claim 10, wherein the second identity matrix smaller than the first identity matrix is determined by puncturing at least a row or a column of the first identity matrix.

14. The method of claim 13, wherein a specific row or column that is punctured is determined between a transmitting entity and a receiving entity.

15. The method of claim 10, wherein the single matrix is determined according to a systematic extended Golay code.

16. The method of claim 15, wherein the single matrix based on the systematic extended Golay code comprises:

| | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| First identity matrix: $I_{12\times12}$ | 1 | 0 | 0 | 0 | 0 | 0 | 0 | 0 | 0 | 0 | 0 | 0 |
| | 0 | 1 | 0 | 0 | 0 | 0 | 0 | 0 | 0 | 0 | 0 | 0 |
| | 0 | 0 | 1 | 0 | 0 | 0 | 0 | 0 | 0 | 0 | 0 | 0 |
| | 0 | 0 | 0 | 1 | 0 | 0 | 0 | 0 | 0 | 0 | 0 | 0 |
| | 0 | 0 | 0 | 0 | 1 | 0 | 0 | 0 | 0 | 0 | 0 | 0 |
| | 0 | 0 | 0 | 0 | 0 | 1 | 0 | 0 | 0 | 0 | 0 | 0 |
| | 0 | 0 | 0 | 0 | 0 | 0 | 1 | 0 | 0 | 0 | 0 | 0 |
| | 0 | 0 | 0 | 0 | 0 | 0 | 0 | 1 | 0 | 0 | 0 | 0 |
| | 0 | 0 | 0 | 0 | 0 | 0 | 0 | 0 | 1 | 0 | 0 | 0 |
| | 0 | 0 | 0 | 0 | 0 | 0 | 0 | 0 | 0 | 1 | 0 | 0 |
| | 0 | 0 | 0 | 0 | 0 | 0 | 0 | 0 | 0 | 0 | 1 | 0 |
| | 0 | 0 | 0 | 0 | 0 | 0 | 0 | 0 | 0 | 0 | 0 | 1 |
| First Parity matrix: $P_{12\times12}$ | 0 | 1 | 1 | 1 | 1 | 1 | 1 | 1 | 1 | 1 | 1 | 1 |
| | 1 | 1 | 1 | 0 | 1 | 1 | 1 | 0 | 0 | 0 | 1 | 0 |
| | 1 | 1 | 0 | 1 | 1 | 1 | 0 | 0 | 0 | 1 | 0 | 1 |
| | 1 | 0 | 1 | 1 | 1 | 0 | 0 | 0 | 1 | 0 | 1 | 1 |
| | 1 | 1 | 1 | 1 | 0 | 0 | 0 | 1 | 0 | 1 | 1 | 0 |
| | 1 | 1 | 1 | 0 | 0 | 0 | 1 | 0 | 1 | 1 | 0 | 1 |
| | 1 | 1 | 0 | 0 | 0 | 1 | 0 | 1 | 1 | 0 | 1 | 1 |
| | 1 | 0 | 0 | 0 | 1 | 0 | 1 | 1 | 0 | 1 | 1 | 1 |
| | 1 | 0 | 0 | 1 | 0 | 1 | 1 | 0 | 1 | 1 | 1 | 0 |
| | 1 | 0 | 1 | 0 | 1 | 1 | 0 | 1 | 1 | 1 | 0 | 0 |
| | 1 | 1 | 0 | 1 | 1 | 0 | 1 | 1 | 1 | 0 | 0 | 0 |
| | 1 | 0 | 1 | 1 | 0 | 1 | 1 | 1 | 0 | 0 | 0 | 1. |

17. A method of coding information for transmission in a mobile communication system, the method comprising:
storing a single matrix comprising a first identity matrix having 14 rows and 14 columns and a first parity matrix having 19 rows and 14 columns;
determining a generating matrix according to the single matrix and a code (n, k), the generating matrix comprising a second identity matrix having equal to or less than 14 rows and equal to or less than 14 columns and a second parity matrix having equal to or less than 19 rows and equal to or less than 14 columns;
encoding information bits into code words for transmission using the generating matrix, wherein a number of coded bits per codeword is n and a number of information bits coded to generate each codeword is k; and
transmitting the code words,
wherein the second identity matrix is a subset of the first identity matrix, the second parity matrix is a subset of the first parity matrix and the second identity matrix and the second parity matrix are based on n and k.

18. The method of claim 17, wherein the part of single matrix is determined according to a systematic extended Golay code.

19. The method of claim 17, wherein the second parity matrix smaller than the first parity matrix is determined by puncturing at least a row or a column of the first parity matrix.

20. The method of claim 19, wherein a specific row or column that is punctured is determined between a transmitting entity and a receiving entity.

21. The method of claim 17, wherein the second identity matrix smaller than the first identity matrix is determined by puncturing at least a row or a column of the first identity matrix.

22. The method of claim 21, wherein a specific row or column that is punctured is determined between a transmitting entity and a receiving entity.

23. The method of claim 17, wherein the single matrix comprises:

| | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| First identity matrix $I_{14\times14}$ | 1 | 0 | 0 | 0 | 0 | 0 | 0 | 0 | 0 | 0 | 0 | 0 | 0 | 0 |
| | 0 | 1 | 0 | 0 | 0 | 0 | 0 | 0 | 0 | 0 | 0 | 0 | 0 | 0 |
| | 0 | 0 | 1 | 0 | 0 | 0 | 0 | 0 | 0 | 0 | 0 | 0 | 0 | 0 |
| | 0 | 0 | 0 | 1 | 0 | 0 | 0 | 0 | 0 | 0 | 0 | 0 | 0 | 0 |
| | 0 | 0 | 0 | 0 | 1 | 0 | 0 | 0 | 0 | 0 | 0 | 0 | 0 | 0 |
| | 0 | 0 | 0 | 0 | 0 | 1 | 0 | 0 | 0 | 0 | 0 | 0 | 0 | 0 |
| | 0 | 0 | 0 | 0 | 0 | 0 | 1 | 0 | 0 | 0 | 0 | 0 | 0 | 0 |
| | 0 | 0 | 0 | 0 | 0 | 0 | 0 | 1 | 0 | 0 | 0 | 0 | 0 | 0 |
| | 0 | 0 | 0 | 0 | 0 | 0 | 0 | 0 | 1 | 0 | 0 | 0 | 0 | 0 |
| | 0 | 0 | 0 | 0 | 0 | 0 | 0 | 0 | 0 | 1 | 0 | 0 | 0 | 0 |
| | 0 | 0 | 0 | 0 | 0 | 0 | 0 | 0 | 0 | 0 | 1 | 0 | 0 | 0 |
| | 0 | 0 | 0 | 0 | 0 | 0 | 0 | 0 | 0 | 0 | 0 | 1 | 0 | 0 |
| | 0 | 0 | 0 | 0 | 0 | 0 | 0 | 0 | 0 | 0 | 0 | 0 | 1 | 0 |
| | 0 | 0 | 0 | 0 | 0 | 0 | 0 | 0 | 0 | 0 | 0 | 0 | 0 | 1 |
| First parity matrix $\overline{P}_{19\times14}$ | 1 | 0 | 1 | 1 | 0 | 1 | 1 | 1 | 0 | 0 | 1 | 0 | 1 | 1 |
| | 1 | 1 | 0 | 1 | 1 | 0 | 1 | 1 | 1 | 0 | 0 | 1 | 1 | 0 |
| | 1 | 0 | 1 | 0 | 1 | 1 | 0 | 1 | 1 | 1 | 0 | 0 | 1 | 0 |
| | 1 | 0 | 0 | 1 | 0 | 1 | 1 | 0 | 1 | 1 | 1 | 0 | 0 | 1 |
| | 1 | 0 | 0 | 0 | 1 | 0 | 1 | 1 | 0 | 1 | 1 | 1 | 0 | 1 |
| | 1 | 1 | 0 | 0 | 0 | 1 | 0 | 1 | 1 | 0 | 1 | 1 | 1 | 0 |
| | 1 | 1 | 1 | 0 | 0 | 0 | 1 | 0 | 1 | 1 | 0 | 1 | 1 | 0 |

-continued

| $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|
| 1 | 1 | 1 | 1 | 0 | 0 | 0 | 1 | 0 | 1 | 1 | 0 | 0 | 0 |
| 1 | 0 | 1 | 1 | 1 | 0 | 0 | 0 | 1 | 0 | 1 | 1 | 0 | 0 |
| 1 | 1 | 0 | 1 | 1 | 1 | 0 | 0 | 0 | 1 | 0 | 1 | 0 | 0 |
| 1 | 1 | 1 | 0 | 1 | 1 | 1 | 0 | 0 | 0 | 1 | 0 | 0 | 0 |
| 0 | 1 | 1 | 1 | 1 | 1 | 1 | 1 | 1 | 1 | 1 | 1 | 0 | 0 |
| 1 | 1 | 1 | 0 | 1 | 1 | 1 | 0 | 0 | 0 | 0 | 0 | 0 | 0 |
| 1 | 1 | 0 | 1 | 1 | 1 | 0 | 0 | 0 | 0 | 0 | 0 | 0 | 0 |
| 1 | 0 | 1 | 1 | 1 | 0 | 0 | 0 | 0 | 0 | 0 | 0 | 0 | 0 |
| 0 | 1 | 1 | 1 | 0 | 0 | 0 | 0 | 0 | 0 | 0 | 0 | 0 | 0 |
| 1 | 1 | 1 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0. |

24. A method of receiving coded information in a mobile communication system, the method comprising:
  storing a single matrix comprising a first identity matrix having r rows and c columns and a first parity matrix having s rows and t columns;
  receiving code words comprising information encoded using a generating matrix;
  determining the generating matrix according to the single matrix and a code (n, k), the generating matrix comprising a second identity matrix having equal to or less than r rows and equal to or less than c columns and a second parity matrix having equal to or less than s rows and equal to or less than t columns; and
  decoding the received code words into the information using the generating matrix, wherein a number of coded bits per codeword is n and a number of information bits coded to generate each codeword is k,
  wherein the second identity matrix is a subset of the first identity matrix, the second parity matrix is a subset of the first parity matrix and the second identity matrix and the second parity matrix are based on n and k.

25. The method of claim 24, wherein:
  $12 \leq n \leq 24$,
  $k=12$,
  $r=12$,
  $c=12$,
  $s=12$, and
  $t=12$.

26. The method of claim 24, wherein:
  $n \leq 24$,
  $n-12 \leq k \leq 12$,
  $r=12$,
  $c=12$,
  $s=12$, and
  $t=12$.

27. The method of claim 24, wherein:
  $n=20$,
  $1 \leq k \leq 14$,
  $r=14$,
  $c=14$,
  $s=19$, and
  $t=14$.

28. The method of claim 24, wherein the whole or part of the single matrix is determined according to a systematic extended Golay code.

29. The method of claim 24, wherein the second parity matrix smaller than the first parity matrix is determined by puncturing at least a row or a column of the first parity matrix.

30. The method of claim 29, wherein a specific row or column that is punctured is determined between a transmitting entity and a receiving entity.

31. The method of claim 24, wherein the second identity matrix smaller than the first identity matrix is determined by puncturing at least a row or a column of the first identity matrix.

32. The method of claim 31, wherein a specific row or column that is punctured is determined between a transmitting entity and a receiving entity.

33. A method of receiving coded information in a mobile communication system, the method comprising:
  storing a single matrix having 24 rows and 12 columns and comprising a first identity matrix and a first parity matrix;
  receiving code words comprising information encoded using a generating matrix;
  determining the generating matrix according to the single matrix and a code (n, k), the generating matrix having equal to or less than 24 rows and equal to or less than 12 columns and comprising a second identity matrix and a second parity matrix; and
  decoding the received code words into the information using the generating matrix, wherein a number of coded bits per codeword is n and a number of information bits coded to generate each codeword is k,
  wherein the second identity matrix is a subset of the first identity matrix, the second parity matrix is a subset of the first parity matrix and the second identity matrix and the second parity matrix are based on n and k.

34. The method of claim 33, wherein the single matrix is determined according to a systematic extended Golay code.

35. The method of claim 33, wherein the second parity matrix smaller than the first parity matrix is determined by puncturing at least a row or a column of the first parity matrix.

36. The method of claim 35, wherein a specific row or column that is punctured is determined between a transmitting entity and a receiving entity.

37. The method of claim 33, wherein the second identity matrix smaller than the first identity matrix is determined by puncturing at least a row or a column of the first identity matrix.

38. The method of claim 37, wherein a specific row or column that is punctured is determined between a transmitting entity and a receiving entity.

39. The method of claim 33, wherein the single matrix based on the systematic extended Golay code comprises:

|  | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| First | 1 | 0 | 0 | 0 | 0 | 0 | 0 | 0 | 0 | 0 | 0 | 0 |
| identity | 0 | 1 | 0 | 0 | 0 | 0 | 0 | 0 | 0 | 0 | 0 | 0 |
| matrix: | 0 | 0 | 1 | 0 | 0 | 0 | 0 | 0 | 0 | 0 | 0 | 0 |

-continued

|  | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| $I_{12\times12}$ | 0 | 0 | 0 | 1 | 0 | 0 | 0 | 0 | 0 | 0 | 0 | 0 |
|  | 0 | 0 | 0 | 0 | 1 | 0 | 0 | 0 | 0 | 0 | 0 | 0 |
|  | 0 | 0 | 0 | 0 | 0 | 1 | 0 | 0 | 0 | 0 | 0 | 0 |
|  | 0 | 0 | 0 | 0 | 0 | 0 | 1 | 0 | 0 | 0 | 0 | 0 |
|  | 0 | 0 | 0 | 0 | 0 | 0 | 0 | 1 | 0 | 0 | 0 | 0 |
|  | 0 | 0 | 0 | 0 | 0 | 0 | 0 | 0 | 1 | 0 | 0 | 0 |
|  | 0 | 0 | 0 | 0 | 0 | 0 | 0 | 0 | 0 | 1 | 0 | 0 |
|  | 0 | 0 | 0 | 0 | 0 | 0 | 0 | 0 | 0 | 0 | 1 | 0 |
|  | 0 | 0 | 0 | 0 | 0 | 0 | 0 | 0 | 0 | 0 | 0 | 1 |
| First Parity matrix: $P_{12\times12}$ | 0 | 1 | 1 | 1 | 1 | 1 | 1 | 1 | 1 | 1 | 1 | 1 |
|  | 1 | 1 | 1 | 0 | 1 | 1 | 1 | 0 | 0 | 0 | 1 | 0 |
|  | 1 | 1 | 0 | 1 | 1 | 1 | 0 | 0 | 0 | 1 | 0 | 1 |
|  | 1 | 0 | 1 | 1 | 1 | 0 | 0 | 0 | 1 | 0 | 1 | 1 |
|  | 1 | 1 | 1 | 1 | 0 | 0 | 0 | 1 | 0 | 1 | 1 | 0 |
|  | 1 | 1 | 1 | 0 | 0 | 0 | 1 | 0 | 1 | 1 | 0 | 1 |
|  | 1 | 1 | 0 | 0 | 0 | 1 | 0 | 1 | 1 | 0 | 1 | 1 |
|  | 1 | 0 | 0 | 0 | 1 | 0 | 1 | 1 | 0 | 1 | 1 | 1 |
|  | 1 | 0 | 0 | 1 | 0 | 1 | 1 | 0 | 1 | 1 | 1 | 0 |
|  | 1 | 0 | 1 | 0 | 1 | 1 | 0 | 1 | 1 | 1 | 0 | 0 |
|  | 1 | 1 | 0 | 1 | 1 | 0 | 1 | 1 | 1 | 0 | 0 | 0 |
|  | 1 | 0 | 1 | 1 | 0 | 1 | 1 | 1 | 0 | 0 | 0 | 1. |

40. A method of receiving coding information in a mobile communication system, the method comprising:
storing a single matrix comprising a first identity matrix having 14 rows and 14 columns and a first parity matrix having 19 rows and 14 columns;
receiving code words comprising information encoded using a generating matrix;
determining the generating matrix according to the single matrix and a code (n, k), the generating matrix comprising a second identity matrix having equal to or less than 14 rows and equal to or less than 14 columns and a second parity matrix having equal to or less than 19 rows and equal to or less than 14 columns;
decoding the received code words into the information using the generating matrix, wherein a number of coded bits per codeword is n and a number of information bits coded to generate each codeword is k,
wherein the second identity matrix is a subset of the first identity matrix, the second parity matrix is a subset of the first parity matrix and the second identity matrix and the second parity matrix are based on n and k.

41. The method of claim 40, wherein the part of the single matrix is determined according to a systematic extended Golay code.

42. The method of claim 41, wherein the single matrix comprises:

|  | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| First identity matrix: $\bar{I}_{14\times14}$ | 1 | 0 | 0 | 0 | 0 | 0 | 0 | 0 | 0 | 0 | 0 | 0 | 0 | 0 |
|  | 0 | 1 | 0 | 0 | 0 | 0 | 0 | 0 | 0 | 0 | 0 | 0 | 0 | 0 |
|  | 0 | 0 | 1 | 0 | 0 | 0 | 0 | 0 | 0 | 0 | 0 | 0 | 0 | 0 |
|  | 0 | 0 | 0 | 1 | 0 | 0 | 0 | 0 | 0 | 0 | 0 | 0 | 0 | 0 |
|  | 0 | 0 | 0 | 0 | 1 | 0 | 0 | 0 | 0 | 0 | 0 | 0 | 0 | 0 |
|  | 0 | 0 | 0 | 0 | 0 | 1 | 0 | 0 | 0 | 0 | 0 | 0 | 0 | 0 |
|  | 0 | 0 | 0 | 0 | 0 | 0 | 1 | 0 | 0 | 0 | 0 | 0 | 0 | 0 |
|  | 0 | 0 | 0 | 0 | 0 | 0 | 0 | 1 | 0 | 0 | 0 | 0 | 0 | 0 |
|  | 0 | 0 | 0 | 0 | 0 | 0 | 0 | 0 | 1 | 0 | 0 | 0 | 0 | 0 |
|  | 0 | 0 | 0 | 0 | 0 | 0 | 0 | 0 | 0 | 1 | 0 | 0 | 0 | 0 |
|  | 0 | 0 | 0 | 0 | 0 | 0 | 0 | 0 | 0 | 0 | 1 | 0 | 0 | 0 |
|  | 0 | 0 | 0 | 0 | 0 | 0 | 0 | 0 | 0 | 0 | 0 | 1 | 0 | 0 |
|  | 0 | 0 | 0 | 0 | 0 | 0 | 0 | 0 | 0 | 0 | 0 | 0 | 1 | 0 |
|  | 0 | 0 | 0 | 0 | 0 | 0 | 0 | 0 | 0 | 0 | 0 | 0 | 0 | 1 |
| First parity matrix: $\bar{P}_{19\times14}$ | 1 | 0 | 1 | 1 | 0 | 1 | 1 | 1 | 0 | 0 | 0 | 1 | 0 | 1 |
|  | 1 | 1 | 0 | 1 | 1 | 0 | 1 | 1 | 1 | 0 | 0 | 0 | 1 | 0 |
|  | 1 | 0 | 1 | 0 | 1 | 1 | 0 | 1 | 1 | 1 | 0 | 0 | 1 | 0 |
|  | 1 | 0 | 0 | 1 | 0 | 1 | 1 | 0 | 1 | 1 | 1 | 0 | 0 | 1 |
|  | 1 | 0 | 0 | 0 | 1 | 0 | 1 | 1 | 0 | 1 | 1 | 1 | 0 | 1 |
|  | 1 | 1 | 0 | 0 | 0 | 1 | 0 | 1 | 1 | 0 | 1 | 1 | 0 | 0 |
|  | 1 | 1 | 1 | 0 | 0 | 0 | 1 | 0 | 1 | 1 | 0 | 1 | 1 | 0 |
|  | 1 | 1 | 1 | 1 | 0 | 0 | 0 | 1 | 0 | 1 | 1 | 0 | 0 | 0 |
|  | 1 | 0 | 1 | 1 | 1 | 0 | 0 | 0 | 1 | 0 | 1 | 1 | 0 | 0 |
|  | 1 | 1 | 0 | 1 | 1 | 1 | 0 | 0 | 0 | 1 | 0 | 1 | 0 | 0 |
|  | 0 | 1 | 1 | 1 | 1 | 1 | 1 | 1 | 1 | 1 | 1 | 1 | 0 | 0 |
|  | 1 | 1 | 1 | 0 | 1 | 1 | 1 | 0 | 0 | 0 | 0 | 0 | 0 | 0 |
|  | 1 | 1 | 0 | 1 | 1 | 1 | 0 | 0 | 0 | 0 | 0 | 0 | 0 | 0 |
|  | 1 | 0 | 1 | 1 | 1 | 0 | 0 | 0 | 0 | 0 | 0 | 0 | 0 | 0 |
|  | 0 | 1 | 1 | 1 | 0 | 0 | 0 | 0 | 0 | 0 | 0 | 0 | 0 | 0 |
|  | 1 | 1 | 1 | 0 | 0 | 0 | 0 | 0 | 0 | 0 | 0 | 0 | 0 | 0 |
|  | 1 | 1 | 0 | 0 | 0 | 0 | 0 | 0 | 0 | 0 | 0 | 0 | 0 | 0 |
|  | 1 | 0 | 0 | 0 | 0 | 0 | 0 | 0 | 0 | 0 | 0 | 0 | 0 | 0. |

43. The method of claim 40, wherein the second parity matrix smaller than the first parity matrix is determined by puncturing at least a row or a column of the first parity matrix.

44. The method of claim 43, wherein a specific row or column that is punctured is determined between a transmitting entity and a receiving entity.

45. The method of claim 40, wherein the second identity matrix smaller than the first identity matrix is determined by puncturing at least a row or a column of the first identity matrix.

46. The method of claim 45, wherein a specific row or column that is punctured is determined between a transmitting entity and a receiving entity.

* * * * *